(12) United States Patent
Emori et al.

(10) Patent No.: US 6,297,618 B2
(45) Date of Patent: Oct. 2, 2001

(54) POWER STORAGE DEVICE AND METHOD OF MEASURING VOLTAGE OF STORAGE BATTERY

(75) Inventors: Akihiko Emori; Takuya Kinoshita; Hideki Miyazaki; Yasuyuki Kojima, all of Hitachi; Noboru Akiyama, Hitachinaka, all of (JP)

(73) Assignee: Hitachi Ltd., Tokyo (JP)

( * ) Notice: Subject to any disclaimer, the term of this patent is extended or adjusted under 35 U.S.C. 154(b) by 0 days.

(21) Appl. No.: 09/774,498

(22) Filed: Jan. 31, 2001

(30) Foreign Application Priority Data

Feb. 7, 2000 (JP) .................................................. 12-034312

(51) Int. Cl.7 .......................... H01M 10/44; H01M 10/46
(52) U.S. Cl. ........................................... 320/132; 324/434
(58) Field of Search ..................................... 320/116, 118, 320/120, 128, 132, 139, 145, 149; 324/426, 427, 433, 434

(56) References Cited

U.S. PATENT DOCUMENTS

| 5,710,506 | * | 1/1998 | Broell et al. . | |
|---|---|---|---|---|
| 5,955,869 | * | 9/1999 | Rathmann | 320/132 |
| 6,043,631 | * | 3/2000 | Tsenter | 320/148 |

* cited by examiner

Primary Examiner—Edward H. Tso
(74) Attorney, Agent, or Firm—Hogan & Hartson, L.L.P.

(57) ABSTRACT

A power storage device has a plurality of series-connected storage battery units, battery circuits associated with the storage battery units to control or monitor the storage battery units, respectively; a main circuit of a potential level different from that of the battery circuits; and a potential level changing circuits connecting the battery circuit to the main circuit. The power storage unit is small in construction and operates at a low power consumption in a high control accuracy.

11 Claims, 17 Drawing Sheets

F I G. 4
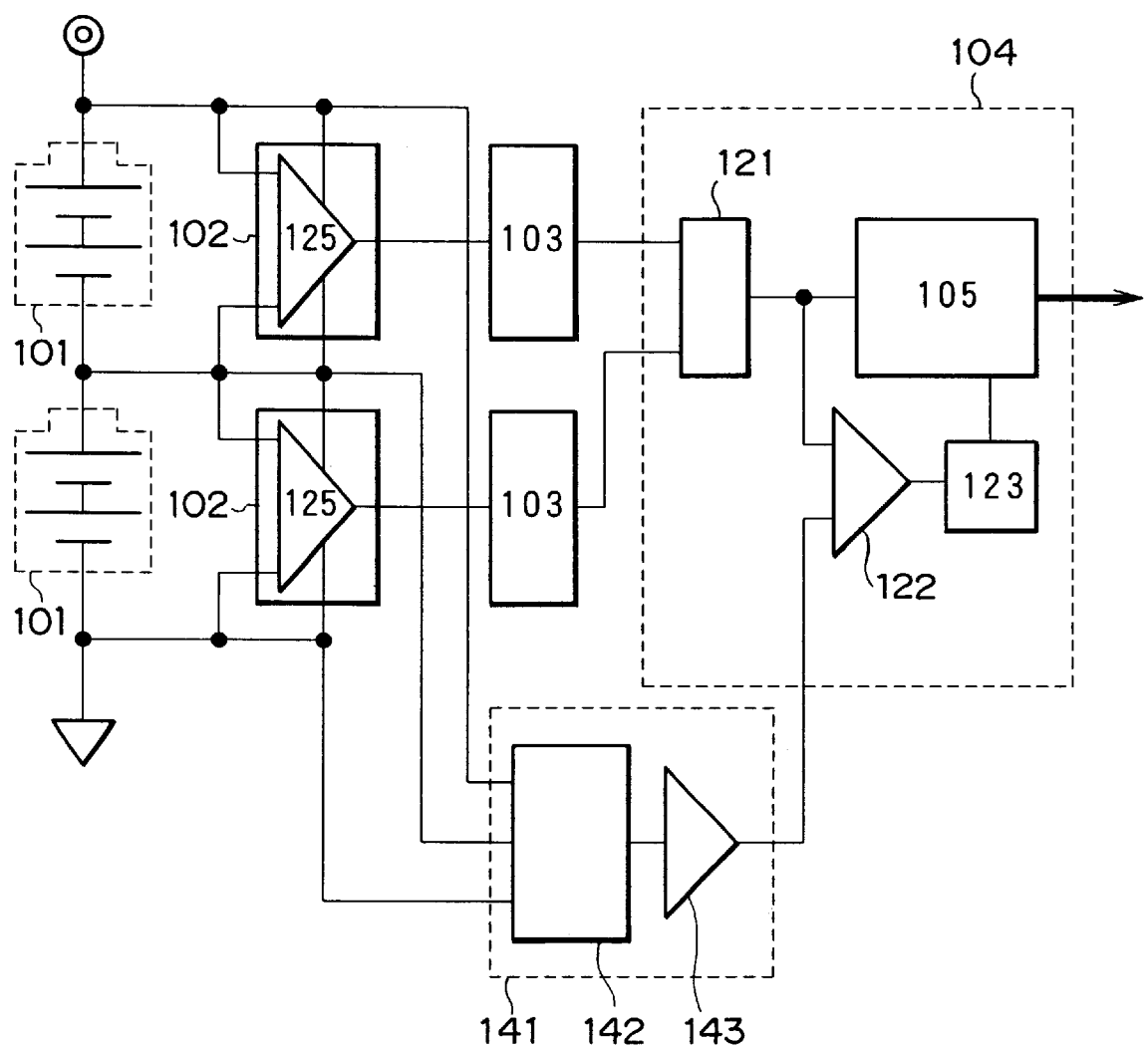

F I G. 14
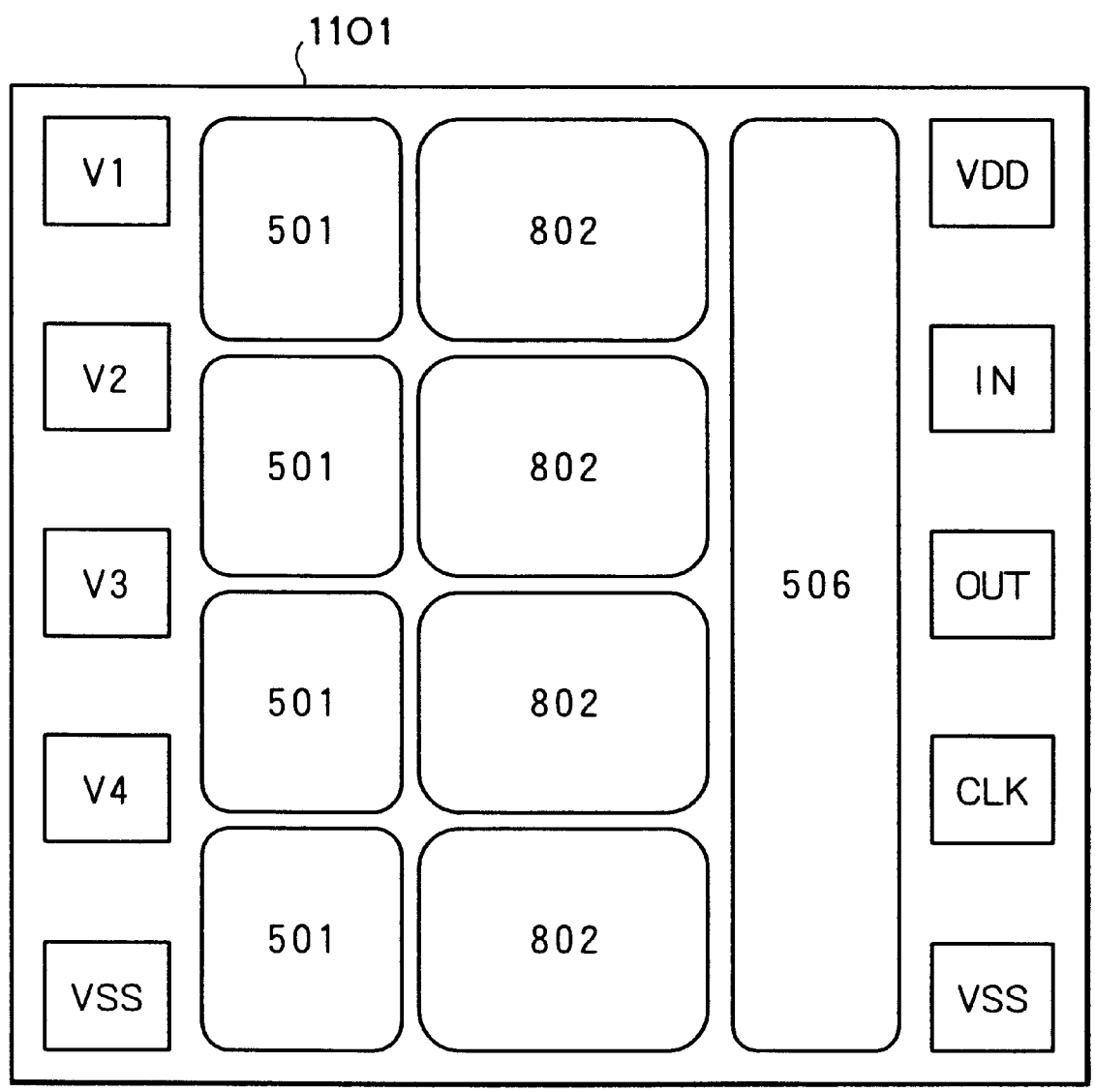

F I G. 15
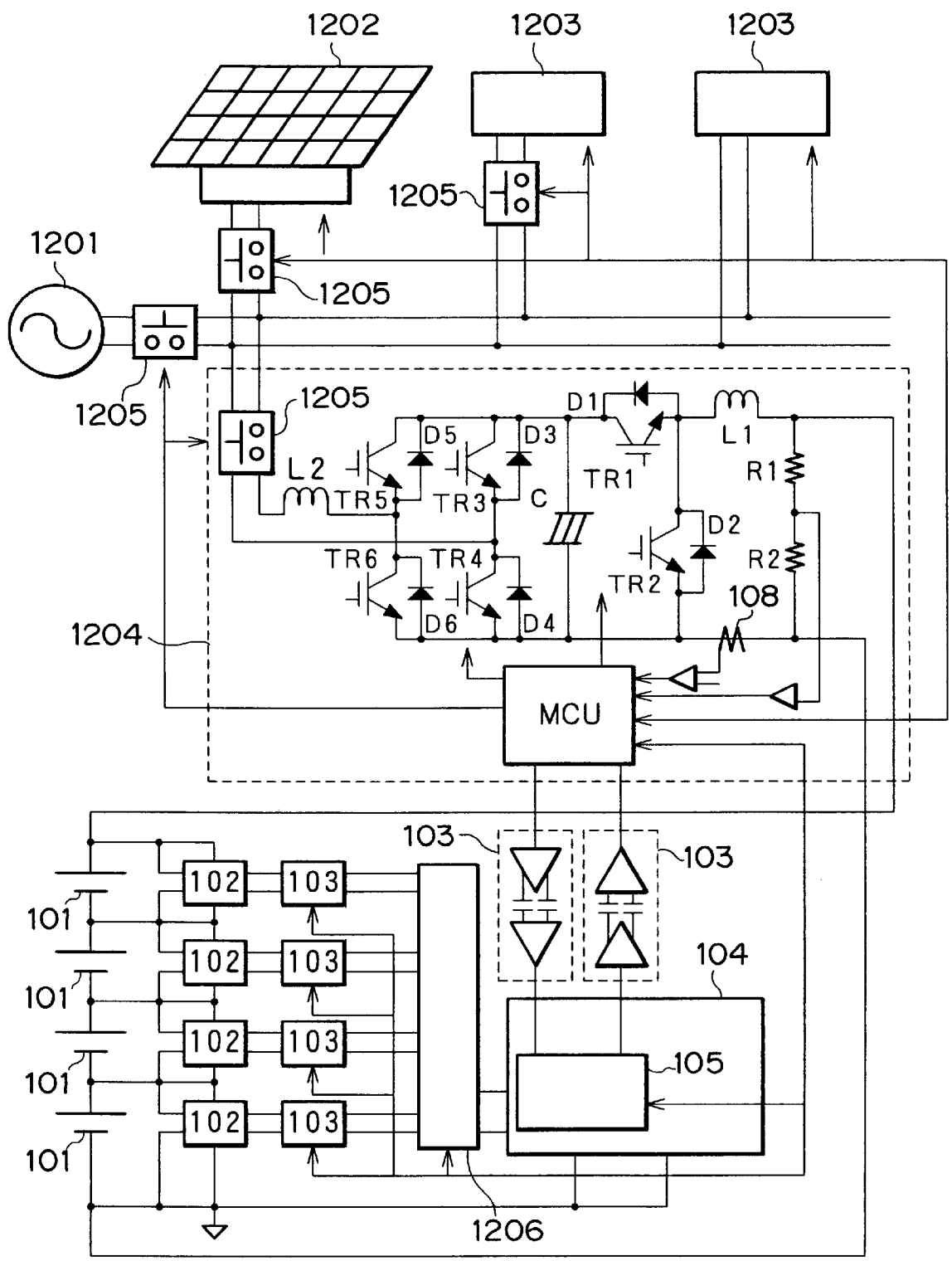

POWER STORAGE DEVICE AND METHOD OF MEASURING VOLTAGE OF STORAGE BATTERY

BACKGROUND OF THE INVENTION

A prior art power storage device is disclosed in Japanese Patent Laid-open No. Hei 8-78060(1996). In this power storage device, two storage battery units are connected in series, and a voltage determining device and a plurality of series-connected resistors are connected across the opposite ends of each of the storage battery units. The voltage determining device provides a voltage indicating whether or not the voltage of the storage battery unit is as high as a predetermined voltage. The series-connected resistors divide the voltage of the storage battery unit to provide a reference voltage.

A comparator compares the output voltage of the voltage determining device with the reference voltage determined by resistance type voltage division. If one of the storage battery units is fully charged and the output voltage of the voltage determining device is higher than the reference voltage, the output of the comparator goes LOW. Then, a FET connected in series to the storage battery unit is turned off to stop charging the storage battery unit.

In this prior art power storage device, the potential levels of the output of the voltage determining devices with respect to the potential level of the lowest negative terminal of the series-connected storage battery units are different. Therefore, the series-connected resistors for determining the reference voltage must be specially formed for the storage battery units. Thus, circuits of the same function conforming to the potential levels of the storage battery units are necessary for the storage battery units.

Since the resistances of the resistors are dispersed in a range around a nominal resistance, the reference voltages indicating a fully charged state differ from each other and the accuracy of the reference voltages is unsatisfactory. Therefore, resistors having resistances close to a desired resistance must be selectively used. Such resistors, however, are expensive.

The withstand voltage of the comparator must be equal to the sum of the voltages of the series-connected storage battery units. Therefore, when many storage battery units are connected in series, an increased number of circuits respectively conforming to the potential levels of those storage battery units are necessary, which increases the cost, size and power consumption of the power storage device and the power storage device needs parts including a comparator having a high withstand voltage.

SUMMARY OF THE INVENTION

A power storage device according to the present invention comprises: a plurality of series-connected storage battery units; a plurality of battery circuits that provides signals of potential levels respectively corresponding to the voltages of the storage battery units; and a plurality of potential level changing circuits for changing the potential levels of the output signals of the battery circuits. The output signals of the potential level changing circuits are given to a signal processing circuit. The signal processing circuit carries out predetermined processes on the basis of input signals or produces a control signal for controlling the storage battery units. The output control signal of the signal processing circuit changes potential levels in the potential level changing circuits and is given to the plurality of battery circuits. The battery circuits control the storage battery units on the basis of the input control signal so that the voltages of the storage battery units are equalized by, for example, bypass circuits. According to the present invention, the signal processing circuit is able to process a plurality of voltage measurement signals through potential level conversion, so that the number of the component parts of the power storage device can be reduced.

The potential level changing circuit of the power storage device according to the present invention is a circuit provided with an insulating coupler interposed between the battery circuits and the signal processing circuit or a level shift circuit. The signal processing circuit of the power storage device according to the present invention is a processor, such as a microcomputer, or a controller.

In the power storage device according to the present invention, an error in measurement included in a power storage unit voltage measured by the storage circuit and caused due to the variation of the element is correction-calculated by the data processing circuit.

In the power storage device according to the present invention, the battery circuits provides pulse signals respectively corresponding to the storage battery units. The potential level of each pulse signal is changed by the potential level changing circuit. The pulse signals are digital signals or differential pulse signals. Use of the pulse signals reduces errors in voltage measurement due potential level change. The pulse signal is a pulse signal of a pulse width corresponding to the voltage of the storage battery unit or a pulse train continuous for a time period corresponding to the voltage of the storage battery unit. Conversion of the voltage of the storage battery unit, which is an analog value, into a pulse signal improves the accuracy of voltage measurement. The conversion of the voltage into the pulse signal can be achieved by various method, such as a method using hardware, such as a circuit and a method using software, such as a microcomputer.

The power storage device according to the present invention is applied to various storage battery units capable of an electric power storage function, such as secondary battery units including lithium battery units and nickel-hydrogen battery units, and electric double layer capacitors, and to a device formed by connecting storage battery units in series. The power storage device according to the present invention is applied to various storage battery systems, such as a storage battery system formed by connecting in series a plurality of storage battery groups each formed by connecting a plurality of storage battery units in series or in parallel.

BRIEF DESCRIPTION OF THE DRAWINGS

FIG. 4 is a block diagram of a power storage device in a fourth embodiment according to the present invention;

FIG. 14 is a plan view of an eleventh embodiment of the present invention;

FIG. 15 is a block diagram of a power storage device in a twelfth embodiment according to the present invention;

DESCRIPTION OF THE PREFERRED EMBODIMENTS

Figure 1:
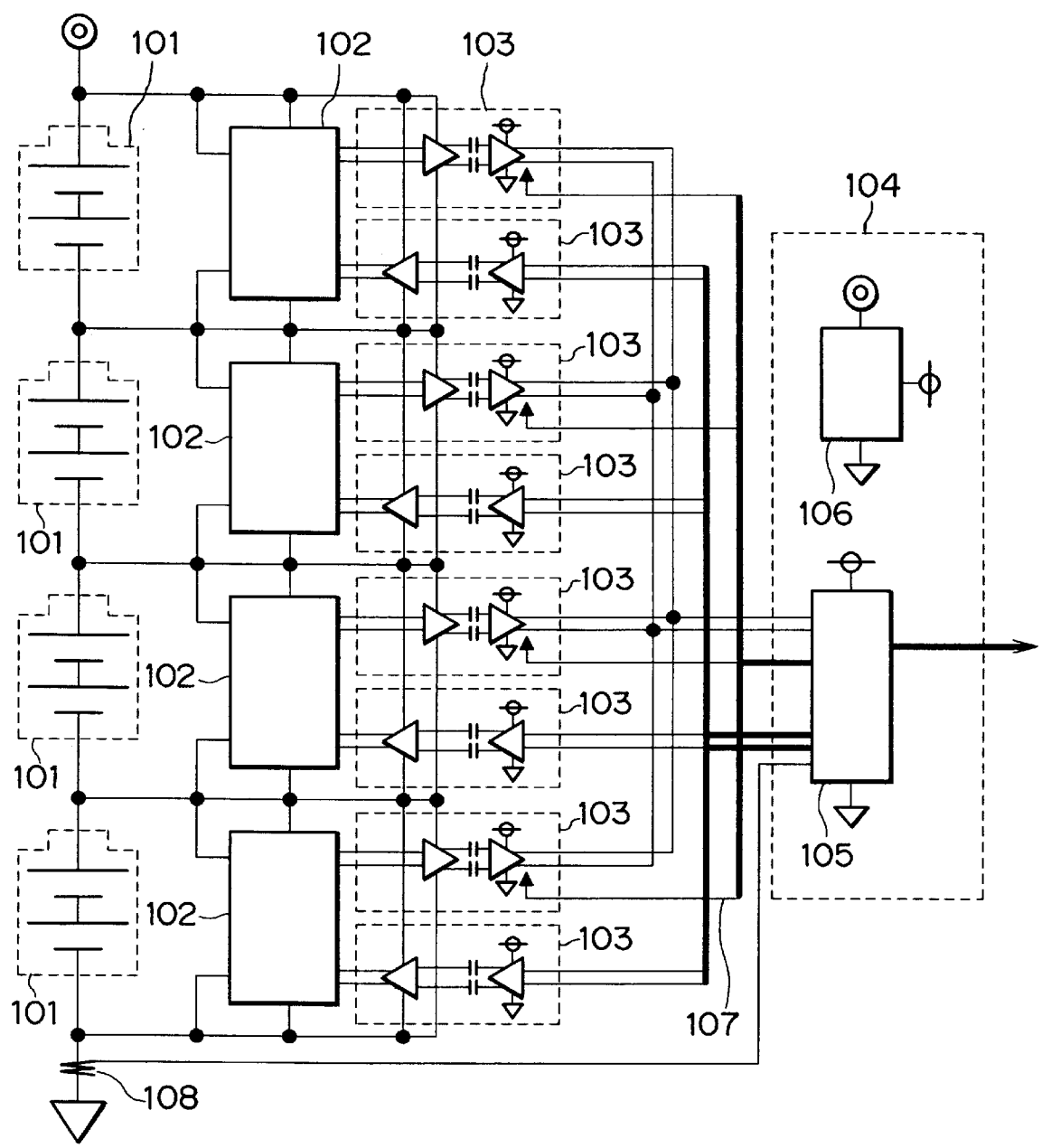
FIG. 1 is a block diagram of a power storage device in a first embodiment according to the present invention.

Preferred embodiments of the present invention will be described hereinafter with reference to the accompanying drawings, in which like parts are denoted by the same reference characters.

First Embodiment

FIG. 1 shows a power storage device in a first embodiment according to the present invention. Shown in FIG. 1 are storage battery units 101, battery circuits 102, potential level changing circuits 103, a main circuit 104, a microcomputer 105, a power supply 106, an enable signal 107 and a current measuring circuit 108. The four storage battery units 101 are connected in series, and the battery circuits 102 are connected in parallel to the storage battery units 101, respectively. The battery circuits 102 are connected through the potential level changing circuits 103 to the main circuit 104.

Each battery circuit 102 has a voltage measuring circuit and a bypass circuit, the battery circuit 102 measures voltage between the terminals of the corresponding storage battery unit 101. The bypass circuit controls the voltage of the corresponding storage battery unit to reduce differences in voltage between the storage battery units 101 to the least possible extent.

The main circuit 104 has the microcomputer 105 and the power supply 106. The output of the current measuring circuit 108 is given to the microcomputer 105.

The microcomputer 105 estimates the open-circuit voltages of the storage battery units 101, determines the charged state of the storage battery units 101 and difference in voltage between the storage battery units, displays remaining amount of charge, drives the bypass circuits and controls the power storage device on the basis of voltages between the terminals of the storage battery units 101 and current measured by the current measuring circuit 108.

Since the storage battery units 101 are connected in series, each battery circuit 102 has a potential level different from that of the main circuit 104. The potential level changing circuits 103 change the different potentials of the battery circuits 102 and provide electric signals.

In this embodiment, the potential level changing circuits 103 are insulating couplers of a capacitive coupling type.

The potential level changing circuits 103 may be of other insulating coupling type, such as a transformer coupling type or a photocoupler type, or may be level shift circuits comprising MOS transistors and voltage dividing resistors. Although an input to the insulating couplers is a pair of differential signal to improve noise withstand property, the same may be a single end. The insulating couplers of this embodiment are capacitors, i.e., capacitive insulating barriers, interposed between the battery circuits 102 and the main circuit 104.

An enable signal 107 is applied to each insulating coupler. The outputs of the insulating couplers are given through a common point to the microcomputer 105. The enable signal 107 controls the operations of the insulating couplers. The outputs of the insulating couplers are transferred through the common point to reduce the number of inputs to the microcomputer 105. If the number of the insulating couplers is small, the outputs of the insulting couplers may be individually given to the microcomputer 105.

Thus, the battery circuits 102 respectively having different potential levels and the main circuit 104 are functionally connected to construct a power storage device capable of monitoring and managing the individual storage battery units and the series-connected storage battery units. Since the circuits operate on the different potential levels, respectively, the withstand voltages of the circuits can be lowered to magnitudes large enough to withstands the potential levels, respectively. Since the main circuit 104 includes all the circuits that carry out common functions including the determination of the charged state of the storage battery units 101 and the voltage differences between the storage battery units 101, the number of circuits, the number of parts and power consumption are reduced, and the power storage device can be formed in a small size at a low cost.

Since control signals and measured values exchanged between the battery circuits 102 and the main circuit 104 are passed through the insulating couplers in pulse signals of digital values in this embodiment, the deterioration of control accuracy and the reduction of noise margin accompanying signal transmission and potential change can be prevented. Although FIG. 1 shows the series-connected four storage battery units 101, naturally, the present invention is applicable to a power storage device having any number of series-connected storage battery units.

As apparent from the foregoing description, the power storage device in the first embodiment has the small number of circuits, is inexpensive and small, is capable of operating at a low power consumption and in a high control accuracy, has a high noise withstand capacity and is highly reliable.

Second Embodiment

Figure 2:
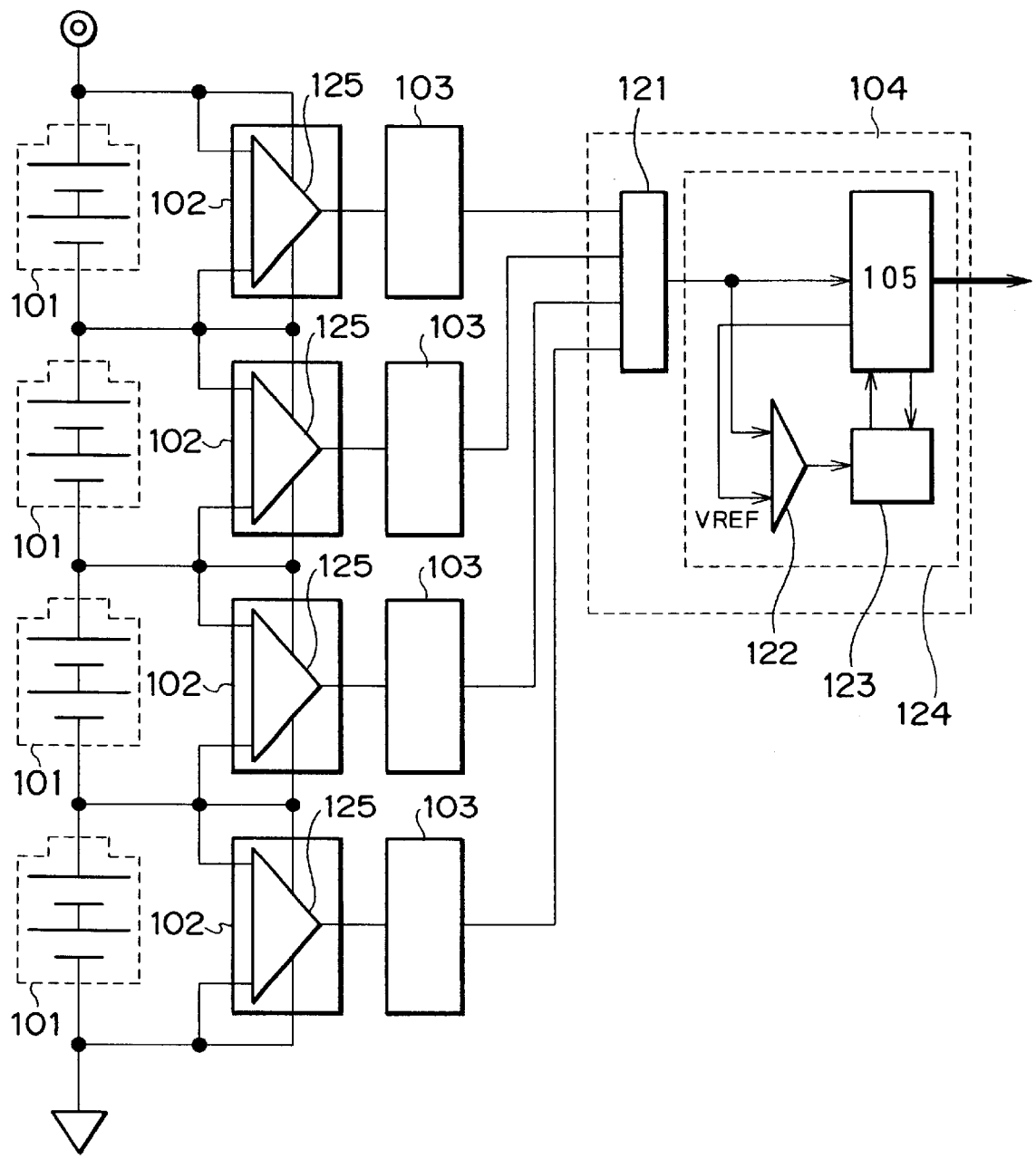
FIG. 2 is a block diagram of a power storage device in a second embodiment according to the present invention.

FIG. 2 shows a power storage device in a second embodiment according to the present invention. Shown in FIG. 2 are a selection circuit 121, a comparator 122, a storage device 123, a corrective circuit 124 and voltage measuring circuits 125.

Each of battery circuits 102 is provided with the voltage measuring circuit 125 for measuring voltage between the terminals of a storage battery unit 101. A main circuit 104 includes the selection circuit 121 and the corrective circuit 124. The corrective circuit 124 includes a microcomputer 105, the comparator 122 and the storage device 123. The selection circuit 121 selects the output of each voltage measuring circuit 125 given thereto through a potential level changing circuit 103 and gives the same to the microcomputer 105 and the comparator 122. The microcomputer 105 reads a correction reference $V_{ref}$, i.e., a true value, from the storage device 123 and gives the same to the comparator 122. The comparator 122 compares the output of the selection circuit 121 and the correction reference $V_{ref}$. The output signal of the comparator 122 is given to the storage device 123.

A working voltage range is predetermined for the storage battery units 101. A true value stored as a correction reference in the storage device 123 is outside the working voltage range.

The storage battery unit 101 is disconnected from the voltage measuring circuit 125 and the correction reference $V_{ref}$ of a reference power supply is applied to the input of the voltage measuring circuit 125. Upon the reception of the output of the selection circuit 121 in this state, the microcomputer 105 decides that the power storage device is in a correction mode. The comparator 122 compares the voltage measured by the voltage measuring circuit 125, i.e., the output of the selection circuit 121, with the correction reference $V_{ref}$ and the difference between the voltage measured by the voltage measuring circuit 125 and the correction reference $V_{ref}$ is stored as an error in the voltage measuring circuit 125 in the storage device 125 to complete the correction mode.

Then, the storage battery unit 101 is connected to the voltage measuring circuit 125 to apply a working voltage to the voltage measuring circuit 125 and the microcomputer 105 executes a correction calculating process on the bas is of the stored error and a correction expression. Thus, the error in the voltage measuring circuit 125 is corrected to improve measuring accuracy and reliability.

The correction reference $V_{ref}$ is produced by reading a value stored beforehand in the storage device 123 by the microcomputer 105. A reference power supply may be used. Although the correction circuit 124 includes the microcomputer 105, the comparator 122 and the storage device 123 in this embodiment, the comparator 122 and the storage device 123 may be incorporated into the microcomputer 105, which is effective in further reducing power consumption, the number of parts and area necessary for laying out the component parts.

Third Embodiment

Figure 3:
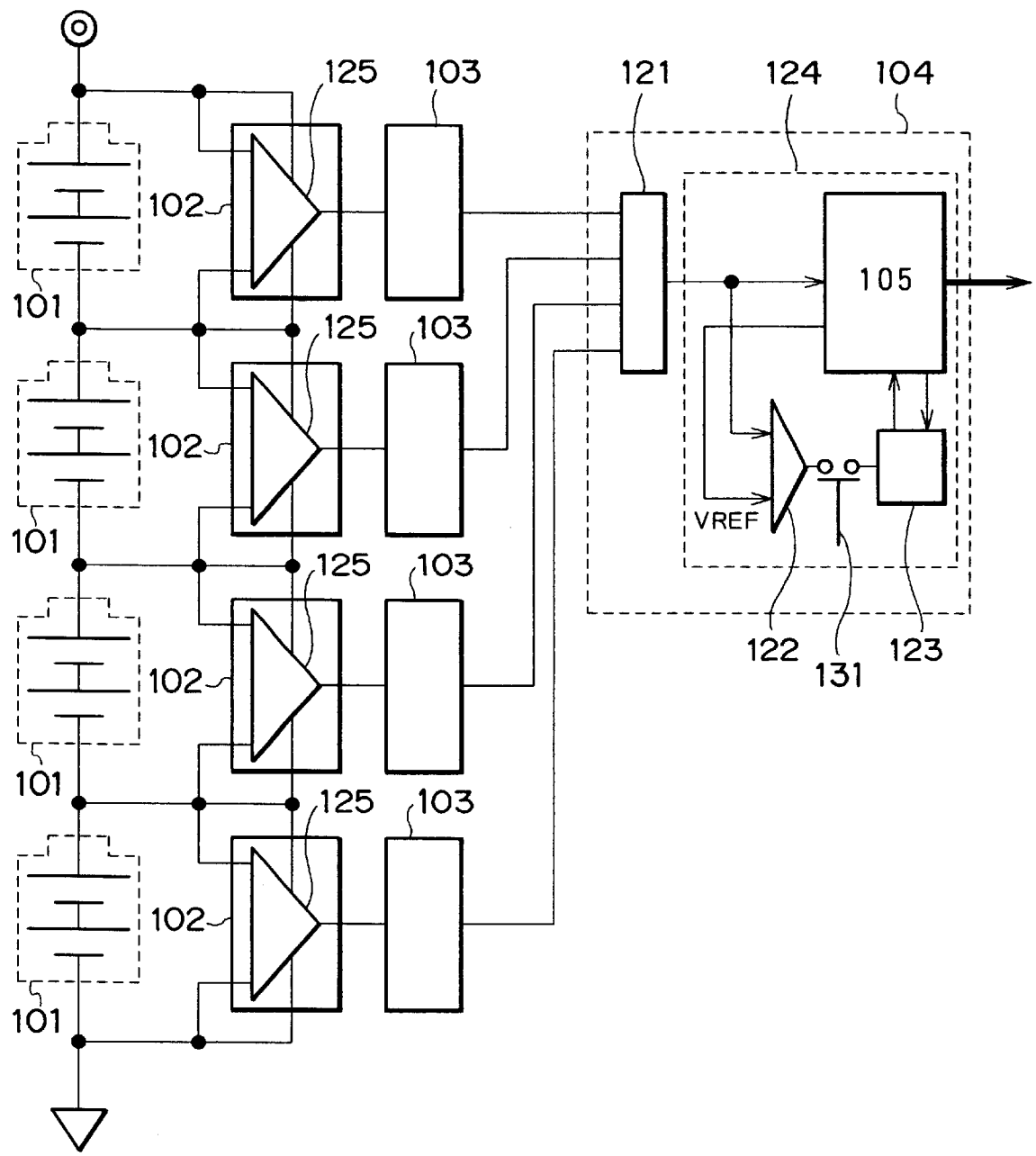
FIG. 3 is a block diagram of a power storage device in a third embodiment according to the present invention.

FIG. 3 shows a power storage device in a third embodiment according to the present invention. Shown in FIG. 3 are a correction switch 131 placed between the output of a comparator 122 and the input of a storage device 123. The correction switch 131 is opened during an ordinary voltage measurement.

In the second embodiment, the microcomputer decides whether or not the power storage device is in the correction mode on the basis of the correction reference $V_{ref}$ provided by the reference power supply applied to the voltage measuring circuit 125. In the third embodiment, when the correction switch 131 is closed, the comparator 122 is connected to the storage device 123, so that it is possible to decide surely that the power storage device is in the correction mode. Thus, an error in the correction mode can be surely stored and reliability is improved. Since this embodiment corrects a measured voltage after potential change, errors that may be produced after correction can be eliminated.

In this embodiment, the comparator 122 and the storage device 123 may be incorporated into a microcomputer 105. In such a case, the microcomputer 105 is provided with a correction switch 131 or a signal input instead of the correction switch 131. Thus, power consumption, the number of parts and area necessary for laying out parts can be reduced.

Fourth Embodiment

FIG. 4 shows a power storage device in a fourth embodiment according to the present invention. Shown in FIG. 4 are a correcting unit 141, a selection circuit 142 and a voltage measuring reference circuit 143.

The correcting unit 141 is provided with the selection circuit 142, the voltage measuring reference circuit 143 and a comparator 122. The input terminals of the selection circuit 142 are connected to the terminals of storage battery units 101. The output of the selection circuit 142 is given through the voltage measurement reference circuit 143 to the comparator 122. The voltage measuring reference circuit 143 is a voltage measuring circuit calibrated beforehand or having a guaranteed accuracy and having an accurate redundant system.

In a correction mode, the comparator 122 compares the output of a selected voltage measuring circuit 125 with the reference output of the voltage measuring reference circuit 143 and an error in the voltage measuring circuit 125 thus obtained is stored in a storage device 123.

Subsequently, the microcomputer 105 processes measured values measured by the voltage measuring circuits 125 to calculate corrections by using the stored errors and a correction expression. Thus, errors in the voltage measuring circuits 125 are corrected and measuring accuracy and reliability are improved.

The power storage device may be provided with voltage measuring reference circuits 143 for all the storage battery units 101. However, since the voltage measuring reference circuits 143 are comparatively expensive and the provision of voltage measuring reference circuits 143 for all the storage battery units 101 increases the number of parts, it is preferable to provide the power storage device with the single voltage measuring reference circuit 143 in combination with the selection circuit 142 for all the storage battery units 101, as shown in FIG. 4. The comparator 122 may be included in the correcting unit 141. The correcting unit 141 may be disconnected from the power storage device while the power storage device is in a mode other than the correction mode.

Fifth Embodiment

Figure 5:
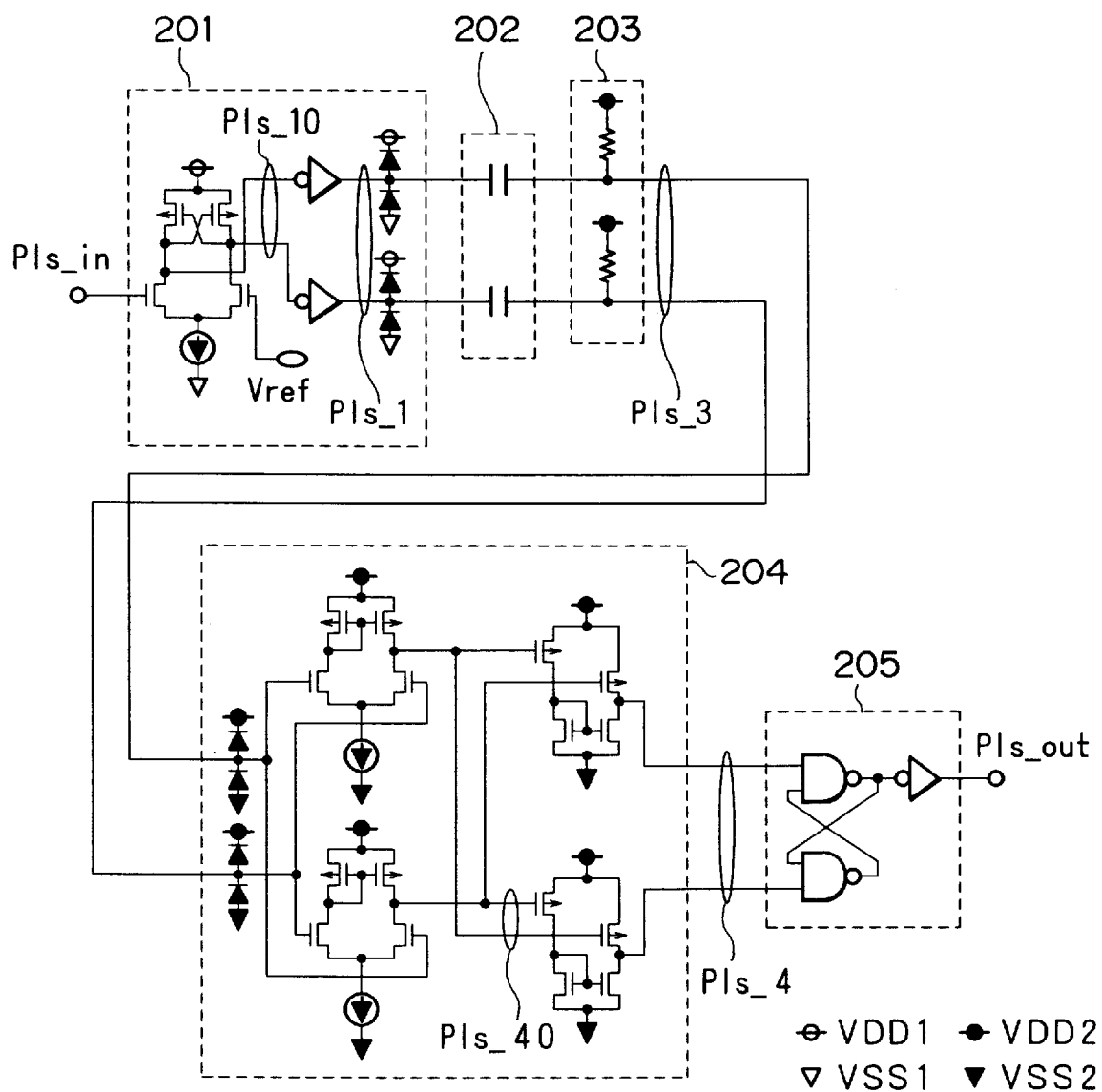
FIG. 5 is a block diagram of a power storage device in a fifth embodiment according to the present invention.

FIG. 5 shows a power storage device in a fifth embodiment according to the present invention. The fifth embodiment is provided with insulating couplers that transmit differential transition signals instead of the potential level changing circuits 103 shown in FIGS. 1 to 4. Shown in FIG. 5 are a differential amplifier circuit 201, an insulating barrier 202, a load resistor 203, a transition detecting circuit 204 and a pulse regenerating circuit 205.

The first stage of the differential amplifier circuit 201 is a CMOS differential amplifier. The differential amplifier circuit 201 compares a reference voltage $V_{ref}$ and an input pulse signal Pls_in and provides a complementary signal Pls_10 indicating the results of comparison. The second stage (driving stage) of the differential amplifier circuit 201 is a CMOS inverter. The CMOS inverter provides a complementary pulse signal pair (output of the differential amplifier circuit) Pls_1 of an amplitude approximately equal to a supply voltage.

The insulating barrier 202 is a capacitive insulating barrier having a dielectric strength between the primary and the secondary side. Diodes are connected in reverse connection to between the respective terminals of the primary and the secondary side and a high potential power supply (VDD1 or VDD2) and a low potential power supply (VSS1 or VSS2) to absorb surges due to noise or the like.

The load resistor 203 is a differential means for giving an output of a differential waveform from the terminal of the primary side to that of the secondary side by capacitive coupling. The load resistor 203 is disposed so as to short-circuit between the high potential power supply VDD2 and the terminal of the secondary side. Normally, the terminal of the secondary side is fixed at the potential of the high potential power supply VDD2. When the terminal of the primary side goes from HIGH to LOW, a signal of a differential waveform spiked on the LOW side is generated.

The transition detecting circuit 204 receives a differential signal Pls_3, detects the leading edge and the trailing edge of an input pulse signal Pls_in and generates a one-shot pulse signal Pls_4. The input stage of the transition detecting circuit 204 is a pair of CMOS differential amplifiers that receives the differential signal pair Pls_3 in a reverse connection. The pair of CMOS differential amplifiers provide single-end signals. Since input signals to the CMOS differential amplifiers are constantly on the same level, the load is a PMOS current mirror.

Only when a potential difference is produced between the pair of differential signals Pls_3 (only when the input pulse signal Pls_in changed), the CMOS differential amplifier provides a differential output (each CMOS differential amplifier provides a single-end output) Pls_40 corresponding to the potential difference. In a steady state, the respective levels of the outputs Pls_40 of the pair of CMOS differential amplifiers are the same. Therefore, the PMOS input level changing circuit is designed so that PMOS input level changing circuit does not provides an output signal of an intermediate level (a level near the logical threshold of the next gate) when input signals of the same level are applied thereto.

For example, a pulse regenerating (demodulating) circuit 205 of the next stage including a flip-flop receives signals by a CMOS NAND gate, the gate width of the MOS gate of the level changing circuit is designed so that the output of the pulse regenerating circuit 205 goes HIGH when the levels of the Pls_40 are the same. Therefore, in the level changing circuit that changes Pls_40 into Pls_4 shown in FIG. 5 the ratio between PMOS gate width and NMOS gate width on the input side and the ratio between PMOS gate width and NMOS gate width on the output side are different from each other. In a steady state, both the outputs of the transition detecting circuit 204 are HIGH, and a one-shot pulse of LOW is generated on one side when the input pulse signal Pls_in rises and on the other side when the input pulse signal Pls_in falls according to the change of the input pulse signal Pls_in.

The pulse regenerating circuit 205 is a flip-flop that regenerates the input pulse signal Pls_in and provides an output pulse Pls_out on the secondary side when the output signal Pls_4 of the transition detecting circuit 204 is applied thereto. In this embodiment, the pulse regenerating circuit 205 is formed of a flip-flop including two CMOS NAND gates, and a CMOS inverter driver. If necessary, the pulse regenerating circuit 205 may be provided with a resetting means for resetting the flip-flop.

In the insulating coupler of this embodiment, the secondary terminal is short-circuited through the load resistor 203 to the high-potential power supply VDD2. Therefore, the rising operation of the primary side is important. Therefore, when logical threshold $V_{LT}$ is lower than (VDD—VSS)/2, the fall time is reduced and the CMOS inverter of the output stage of the differential amplifier circuit 201 is able to suppress the variation of timing.

In this embodiment, the circuits on the opposite sides of the insulating barrier 202 are differential circuits. Therefore, property to withstand common mode noise is improved and S/N ratio increases. The transition detecting circuit 204 connected to the output of the insulating barrier 202 consists of a pair of differential amplifiers. Therefore, an amplifier excellent in CMRR (common mode rejection rate) can be formed. Since the insulating coupling circuit is formed of simple CMOS gates, the power storage device is capable of dealing with low voltages of 5 V or below (to a low volt on the order of 1.8 V) and hence power consumption is small.

Figure 6:
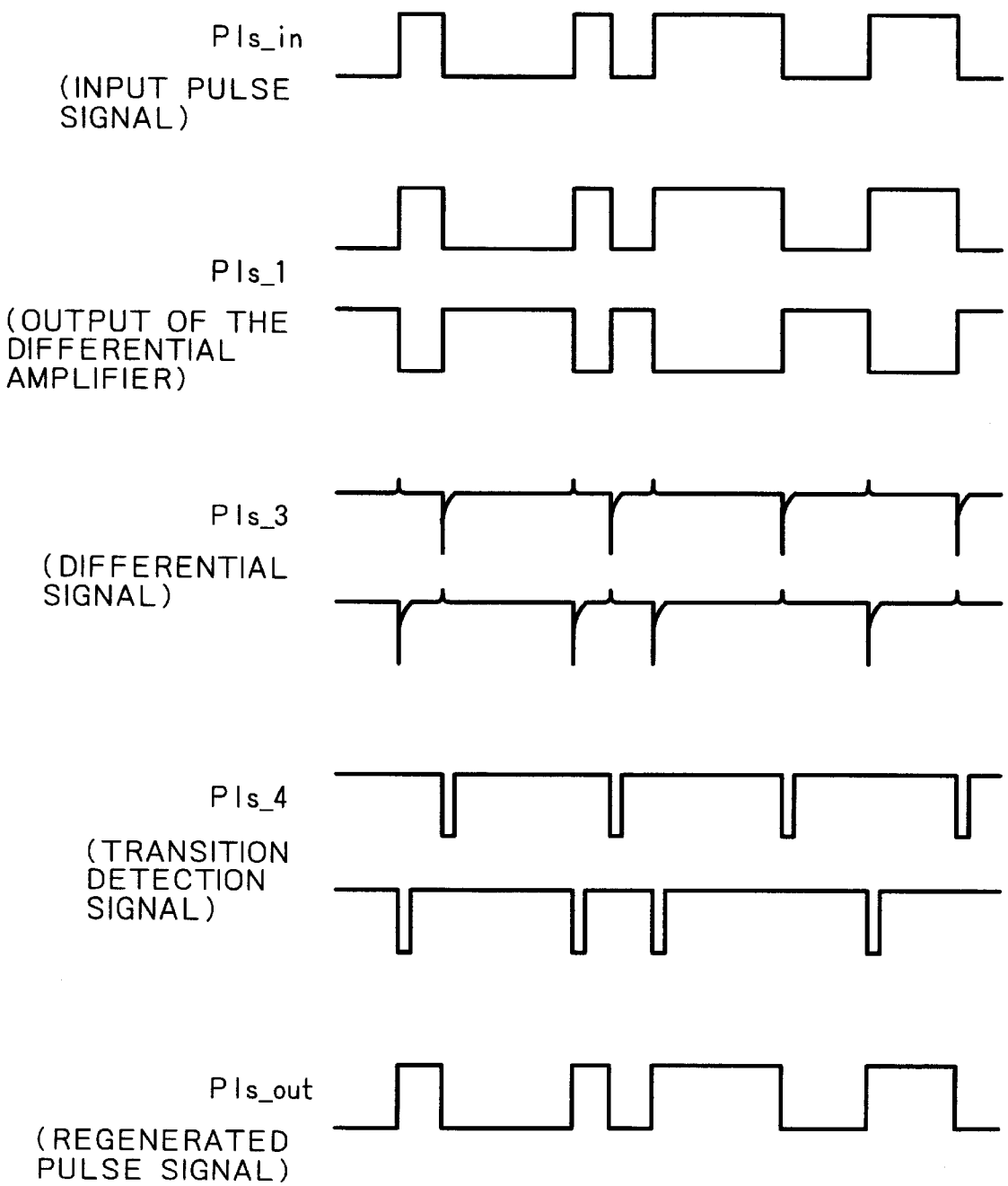
FIG. 6 is a timing diagram of assistance in explaining the operation of the fifth embodiment.

FIG. 6 is a timing chart of assistance in explaining the operation of the circuit shown in FIG. 5. Upon the reception of the input pulse signal Pls_in, the differential amplifier circuit 201 provides the differential signal Pls_1. The load resistor 203 coupled by capacitive coupling with the primary side of the insulating barrier 202 provides the differential signal Pls_3. The output signal Pls_4, i.e., the transition detection signal Pls_4, of the transition detecting circuit 204 is a rectangular pulse signal synchronous with the differential signal Pls_3. The pulse regenerating circuit 205, i.e., the last output stage, provides the regenerated pulse signal Pls_out identical with the input signal Pls_in. The regenerated pulse signal Pls_out is a rectangular pulse signal complementary to and synchronous with the transition detection signal Pls_4. Thus, the differential insulating coupler provides the transition signal of a differential waveform, which reduces the power consumption of the insulating coupler.

Sixth Embodiment

Figure 7:
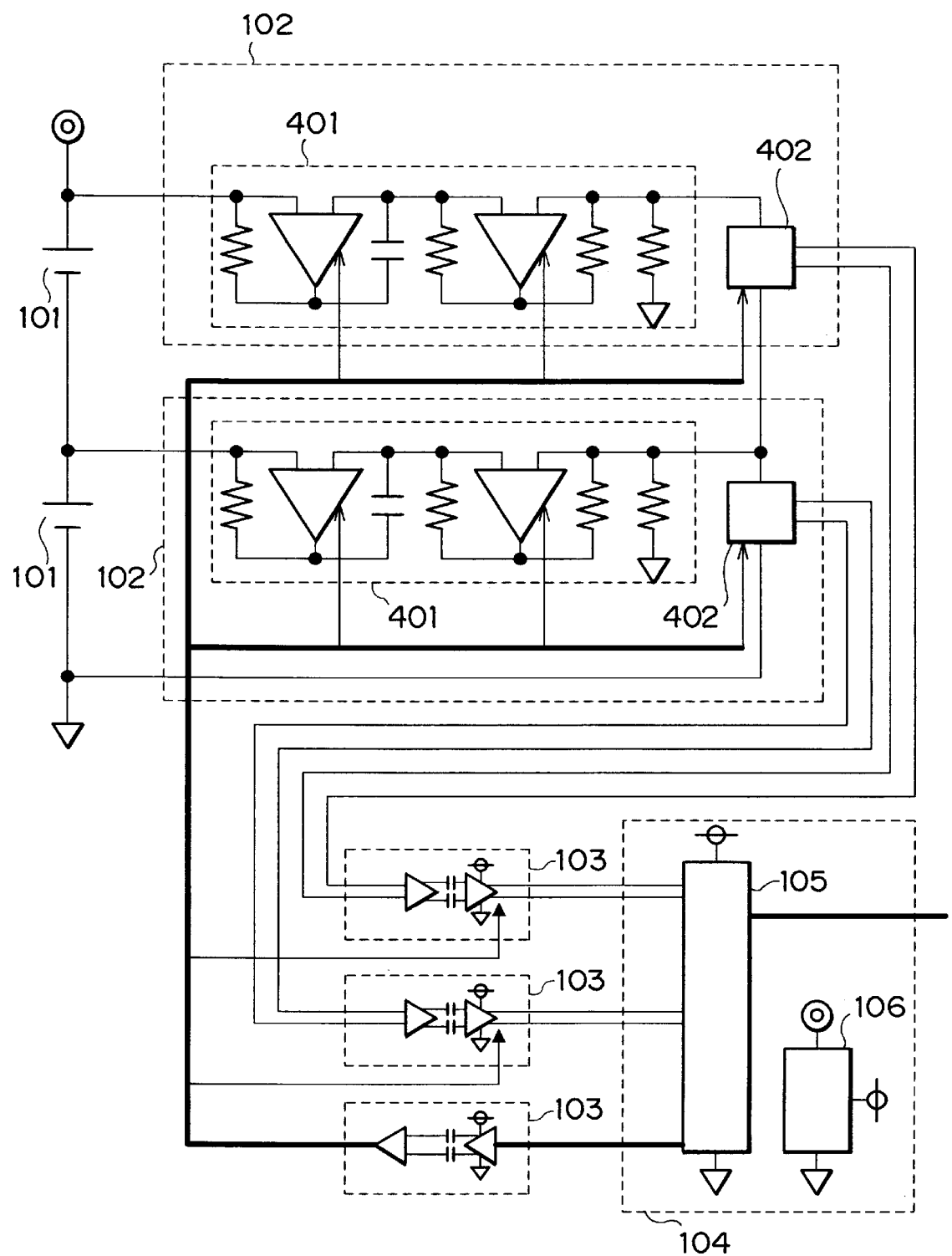
FIG. 7 is a block diagram of a power storage device in a sixth embodiment according to the present invention.

FIG. 7 shows a power storage device in a sixth embodiment according to the present invention. Shown in FIG. 7 are active filters 401 and voltage measuring circuits 402. The power storage device in the sixth embodiment is the same as those in the first to the six embodiment, except that each of battery circuits 102 includes the active filter 401 in the sixth embodiment. Each active filter 401 includes OP amplifiers, resistors and a capacitor. Each active filter 401 is interposed between the voltage measuring circuit 402 and a storage battery unit 101.

The active filter 401 eliminates noise components superposed between the terminals of the storage battery units 101 and gives the dc voltage components of the storage battery unit 101 to the voltage measuring circuit 402. Thus, the erroneous voltage measurement of the voltage measuring circuit 402 due to the influence of the noise components can be prevented, and accuracy and measurement of voltage measurement are improved.

Seventh Embodiment

Figure 8:
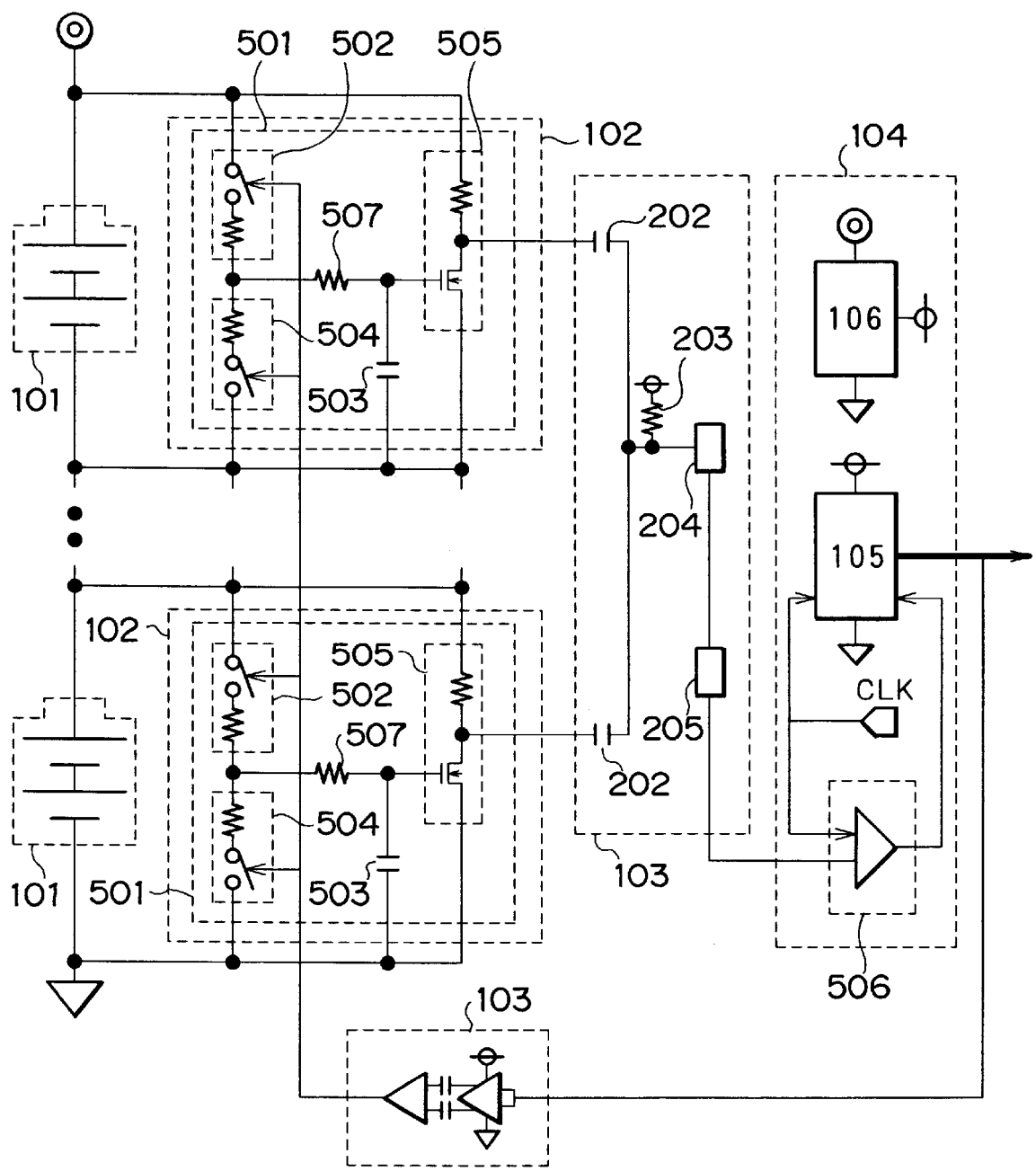
FIG. 8 is a block diagram of a power storage device in a seventh embodiment according to the present invention.

FIG. 8 shows a power storage device in a seventh embodiment according to the present invention. Shown in FIG. 8 are voltage-time conversion circuits 501, charging switches 502, capacitors 503, discharging switches 504, decision circuits 505, a time-voltage conversion circuit 506 and charge-and-discharge resistors 507.

The voltage-time conversion circuit 501 is included in a battery circuit 102 and comprises the charging switch 502, the discharging switch 504 connected in series to the charging switch 502, the capacitor 503 connected through the charge-and-discharge resistor 507 in parallel to the discharging switch 504, and the decision circuit 505 having an input connected to the common joint of the charge-and-discharge resistor 507 and the capacitor 503. The time-voltage conversion circuit 506 has a comparator. An insulating coupler 103 connecting the voltage-time conversion circuits 501 and the time-voltage conversion circuit 506 is a single end, has insulating barriers 202 having secondary sides connected together, and the joint of the secondary sides of the insulating barriers 202 is connected to a load resistor 203, a transition detecting circuit 204 and a pulse regenerating circuit 205.

The operation of the voltage-time conversion circuit 501 will be described. The charging switch 502 is closed and the discharging switch 504 is opened to charge the capacitor 503 to a voltage equal to the terminal voltage $V_B$ of the storage battery unit 101. Then, the charging switch 502 is opened and the discharging switch 504 is closed to discharge the capacitor 503. The output of the decision circuit 505 is inverted upon the drop of the voltage of the capacitor 503 to a threshold voltage $V_{TH}$ (the gate threshold voltage of A MOSFET included in the decision circuit 505 in this embodiment).

The threshold voltage $V_{TH}$ and discharge time t is expressed by:

$$V_{TH}=V_c \cdot \exp(-t/CR) \tag{1}$$

$$t=C \cdot R \cdot \ln(V_c/V_{TH}) \tag{2}$$

where t is the discharge time of the capacitor 503, $V_c$ (=$V_B$) is the voltage of the capacitor 503, C is the capacitance of the capacitor 503, and R is the resistance of the charge-and-discharge resistor 507.

The voltage-time conversion circuit 501 converts the voltage $V_B$ (=$V_c$) of the storage battery unit 101 into the discharge time t, i.e., the pulse width or the pulse interval of the output of the..decision circuit 505. Charging time, similarly to the discharge time t, is converted into pulse width or pulse interval. As obvious from Expression (2), the conversion accuracy of the voltage-time conversion circuit 501 is dependent on C, R and $V_{TH}$. Therefore, devices having characteristics varying in narrow ranges are employed as the capacitor 503, the discharging switch 504, the charge-and-discharge resistor 507 and the decision circuit 505. In particular, it is preferable to employ a bipolar transistor having characteristics varying in a narrow range or a precision comparator for the decision circuit 505. A bipolar transistor has a built-in potential stable under variable temperature and is preferable to reduce the variation of the threshold voltage $V_{TH}$. Generally, capacitance C and resistance R vary with temperature. Therefore, when necessary, a value calculated by using Expression (2) is corrected for temperature correction.

The time-voltage conversion circuit 506 compares the output of the pulse regenerating circuit 205 and a clock signal (CLK signal) by the comparator and generates a pulse train in a period when the output of the pulse regenerating circuit 205 is HIGH. The microcomputer 105 counts the number of pulses of the pulse train and converts the output of the pulse regenerating circuit 205 into a voltage corresponding to the number of pulses. If the voltage of the capacitor 503 is 5 V, the capacitor 503 is discharged for 1 ms and the frequency of the CLK signal is 16 MHz. Then, $$1 \text{ ms}/(\frac{1}{16} \text{ MHz})=16,000 \text{ pulses} \tag{3}$$

and therefore, $$5 \text{ V}/16000=0.33 \text{ mV} \tag{4}$$

Thus, this embodiment is capable of achieving voltage measurement in a high measuring accuracy.

A microcomputer having an input capture function may be used instead of the comparator of the time-voltage conversion circuit 506.

In this embodiment, the secondary sides of the insulating barriers 202 of the insulating coupler are connected together and the joint of the secondary sides of the insulating barriers 202 is connected to the load resistor 203, the transition detecting circuit 204 and the pulse regenerating circuit 205. Therefore, the voltage-time conversion circuits 501 respectively connected to the storage battery units 101 operates sequentially.

In this embodiment, the microcomputer 105 measures the voltages of the storage battery units 101. If the voltages of the storage battery units 101 are different from each other, the microcomputer 105 closes the charging switch 502 and the discharging switch 504 of the voltage-time conversion circuit 501 connected to the storage battery unit 101 of a voltage higher than that of the other storage battery unit 101 simultaneously. Consequently, the bypassing or self-discharging of charging current is carried out through the series circuit of the charging switch 502 and the discharging switch 504 to eliminate the voltage difference.

In this embodiment, the charge-and-discharge resistor 507 not included in the series circuit of the charging switch 502 and the discharging switch 504 is interposed between the discharging switch 504 and the capacitor 503 to adjust discharge time. Therefore, discharge time can be adjusted by properly determining the resistance of the charge-and-discharge resistor 507 so that voltage can be measured in a satisfactory accuracy even if the resistances of the switches are reduced to increase bypass current. Thus, this embodiment uses the voltage measuring circuit and the bypass current for both the series-connected storage battery units 101 to achieve both voltage measurement and voltage difference elimination.

Figure 9:
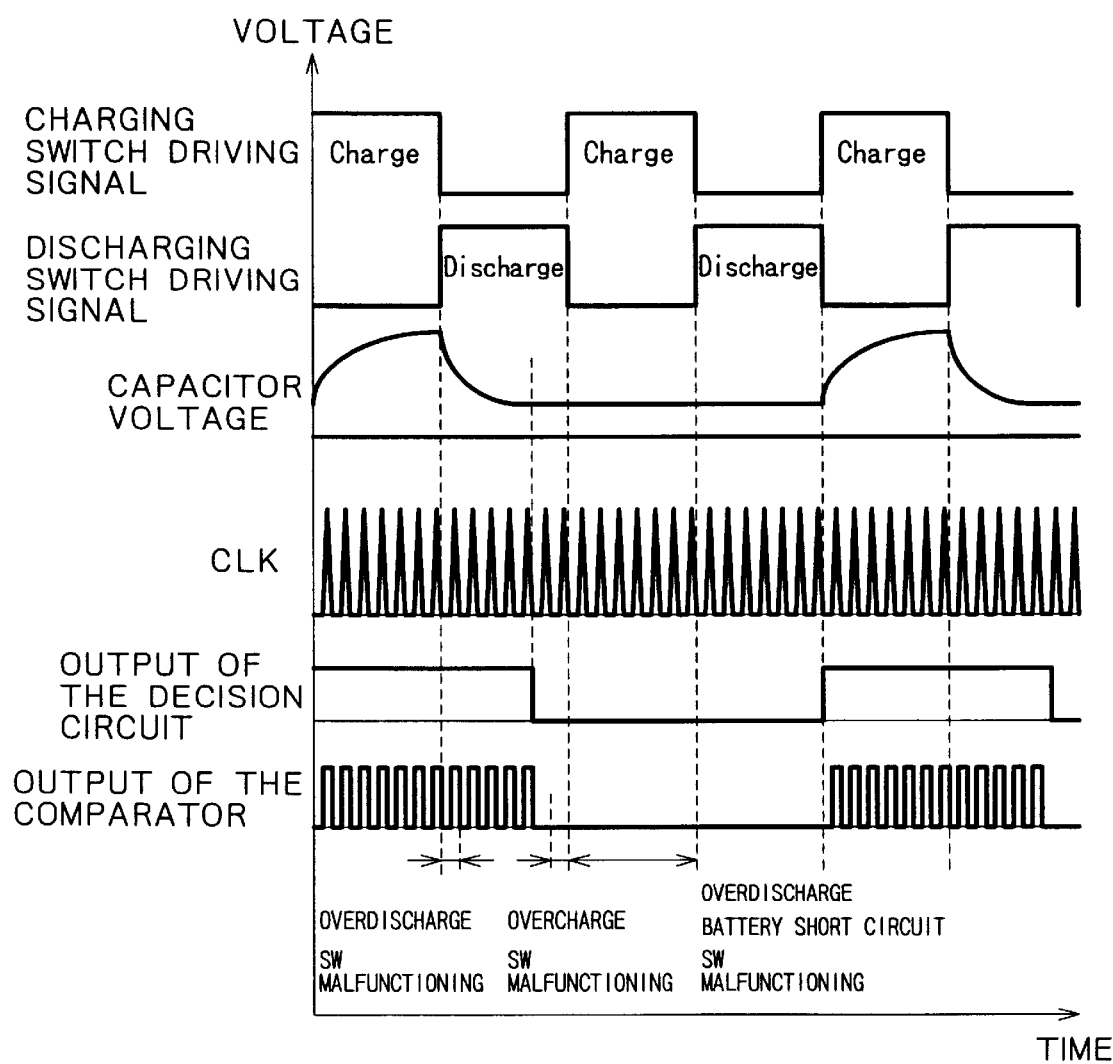
FIG. 9 is a timing diagram of assistance in explaining the operation of the seventh embodiment.

FIG. 9 is a timing chart of assistance in explaining the operation of the power storage device shown in FIG. 8. The capacitor 503 is charged to a voltage equal to that of the storage battery unit 101 in a period where the charging switch 502 is closed (HIGH). When the charging switch 502 is opened (LOW) and the discharging switch 504 is closed, the voltage of the capacitor 503 decreases at an exponential rate. Upon the decrease of the voltage of the capacitor 503 below a predetermined voltage, the output of the decision circuit 505 (transition detecting circuit 205) goes LOW. The comparator compares the output of the transition detecting circuit 205 with a clock signal CLK and gene rates a pulse train until the output of the decision circuit 505 (transition detecting circuit 205) goes LOW.

The microcomputer 105 counts the number of pulses of the pulse train while the discharging switch 504 is closed and converts the number of pulses into a corresponding voltage. If the number of pulses of the pulse train is less than a predetermined number, it is decided that the storage battery unit 101 is over discharged or that the charging switch 502 is malfunctioning. If the number of pulses of the pulse train is a predetermined number or more, it is decided that the storage battery unit 101 is over charged or that the discharging switch 504 is malfunctioning. If any pulse train is not generated while the charging switch 502 is closed, it is decided that the storage battery unit 101 is overdischarged, that the storage battery unit 101 is short-circuited or the charging switch 502 is malfunctioning.

When the charging switch 502 and the discharging switch 504 of the voltage-time conversion circuit 501 are used as a bypass circuit, the condition of a balancing circuit, i.e., whether a balancing circuit is normally operating, can be verified through the decision of whether any pulse train is generated.

Thus, this embodiment has abilities to detect the state of the storage battery unit 101, such as an overcharged state, an overdischarged state or a short-circuited state, and to verify the operation of the voltage-time conversion circuit 501 serving also as a bypass circuit in addition to abilities to measure voltage and potential difference elimination. Since the bypass circuit has the charging switch 502 and the discharging switch 504 which are connected in series, the bypass circuit can be surely disconnected by one of the switches 502 and 504 even if the other switch is short-circuited.

Eighth Embodiment

Figure 10:
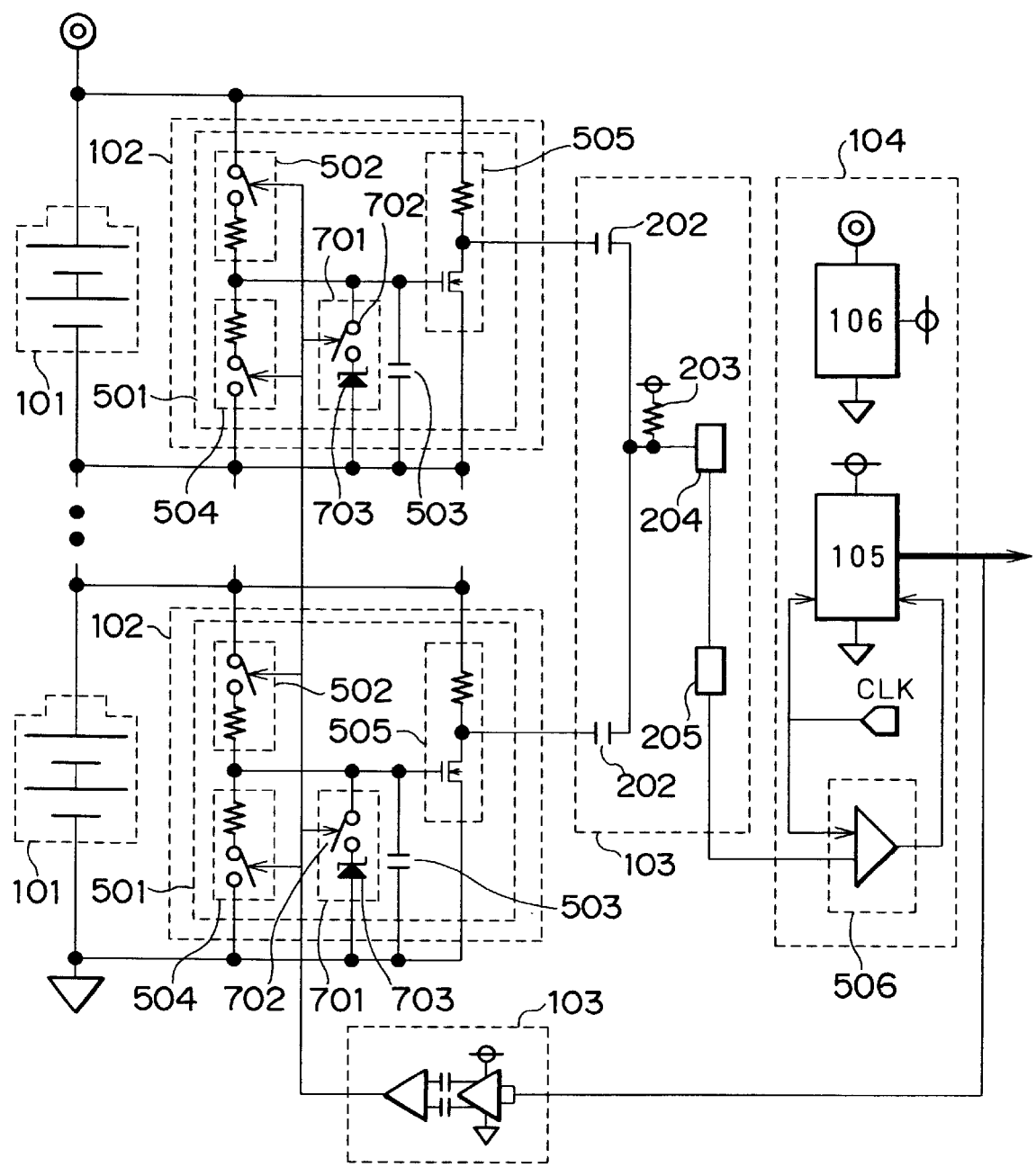
FIG. 10 is a block diagram of a power storage device in an eighth embodiment according to the present invention.

FIG. 10 shows a power storage device in an eighth embodiment according to the present invention. Shown in FIG. 10 are a corrective reference circuit 701, a switch 702 and a reference power supply 703, such as a Zener diode. The corrective reference circuit 701 has the switch 702 and the reference power supply 703.

When necessary, a charging switch 502 and the switch 702 are closed to charge a capacitor 503 to a voltage equal to that of the reference power supply 703. Then, the charging switch 502 and the switch 702 are opened, and a discharging switch 504 is closed to discharge the capacitor 503.

Since the reference voltage $V_{ref}$ of the reference power supply 703 is known, an error in discharge time t with respect to reference discharge time $t_{ref}$ due to the influence of the capacitance C of the capacitor 503, the resistance R of the discharging switch 504, the threshold voltage $V_{TH}$ of a decision circuit and temperature T on time-voltage conversion is corrected.

When the voltage of the reference power supply 703 is $V_{ref}$, and discharge time therefor is $t_{ref1}$, the following expression is expressed.

$$V_{ref1} = V_{TH} \cdot \exp(t_{ref1}/C \cdot R) \quad (5)$$

From Expression (5), time t necessary for discharging the capacitor 503 charged at $V_c$ is expressed by:

$$t = C \cdot R \cdot \ln(V_c/V_{ref1}) + t_{ref1} \quad (6)$$

Thus, the threshold voltage $V_{TH}$ can be determined from the discharge time t. Expression (6) can be rewritten as follows when the power storage device is provided additionally with a second reference power supply, not shown, the voltage is $V_{ref2}$ and discharge time is $t_{ref2}$.

$$t = (t_{ref2} - t_{ref1}) \cdot \ln(V_c/V_{ref1})/\ln(V_{ref2}/V_{ref1}) + t_{ref1} \quad (7)$$

Therefore, the voltage $V_c$ of the storage battery unit 101 can be determined on the basis of the discharge time t even if C and R are unknown. Thus, the voltage $V_c$ of the storage battery unit 101 can be accurately determined even if the capacitance C of the capacitor 503 and the resistance R of the discharging switch 504 are unknown. As obvious from Expression (7), the time t is independent of the capacitance C and the resistance R, and hence the voltage $V_c$ of the storage battery unit 101 can be accurately determined even if the capacitance C and the resistance R change due to temperature change.

Ninth Embodiment

Figure 11:
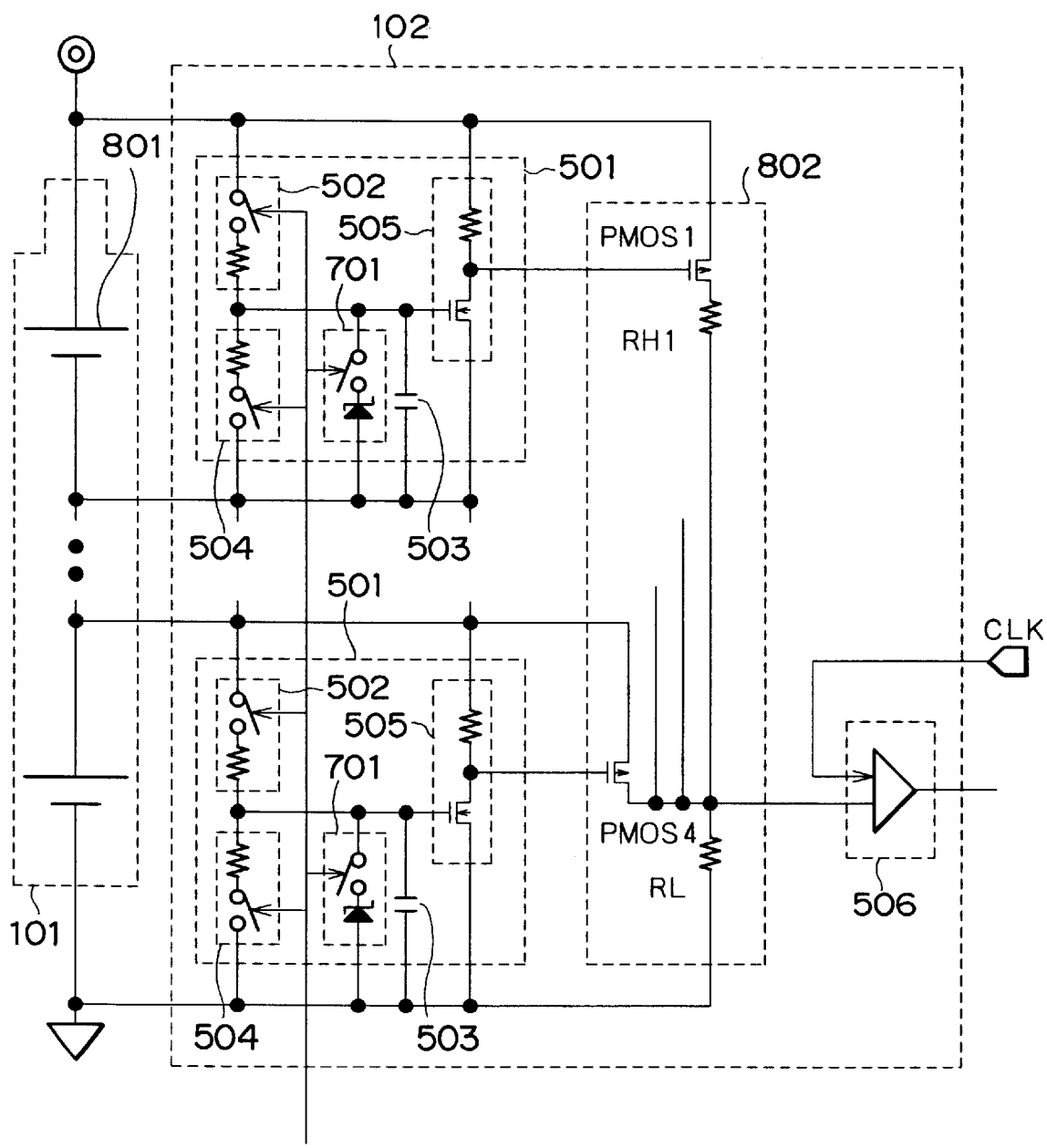
FIG. 11 is a block diagram of a power storage device in a ninth embodiment according to the present invention.

FIG. 11 shows a power storage device in a ninth embodiment according to the present invention. Shown in FIG. 11 are storage batteries 801 and a level shifting circuit 802. The level shifting circuit 802 includes PMOSs and resistors RH and RL. The level shifting circuit 802 changes the potential level and the amplitude of an input signal in the ratio between the resistances of the resistors RH and RL. In this embodiment, a storage battery unit 101 is formed by connecting the plurality of storage batteries 801 in series. A battery circuit 102 includes voltage-time conversion circuits 501 respectively connected to the storage batteries 801, correction reference circuits 701, the level shifting circuit 802, and a time-voltage conversion circuit 506. As shown in FIG. 11, the outputs of the voltage-time conversion circuits 501 are connected to the resistor RL of the level shifting circuit 802.

In this embodiment, the storage batteries 801 are lithium secondary batteries having a maximum supply voltage of 4.2 V. Therefore, the maximum supply voltage of the storage battery unit 101 is 16.8 V when the number of the storage batteries 801 is four and is 33.6 V when the number of the storage batteries 801 is eight. Therefore, the battery circuit 102 may comprise general semiconductor devices having a rated voltage of 18 V or 36 V. When the number of the series-connected storage batteries 801 is eight or below, the battery circuits 102 can be easily embodied by IC chips of the same type or hybrid ICs of the same type, so that the number of parts can be reduced, and the power storage device can be formed in a small size at low costs.

Tenth Embodiment

Figure 12:
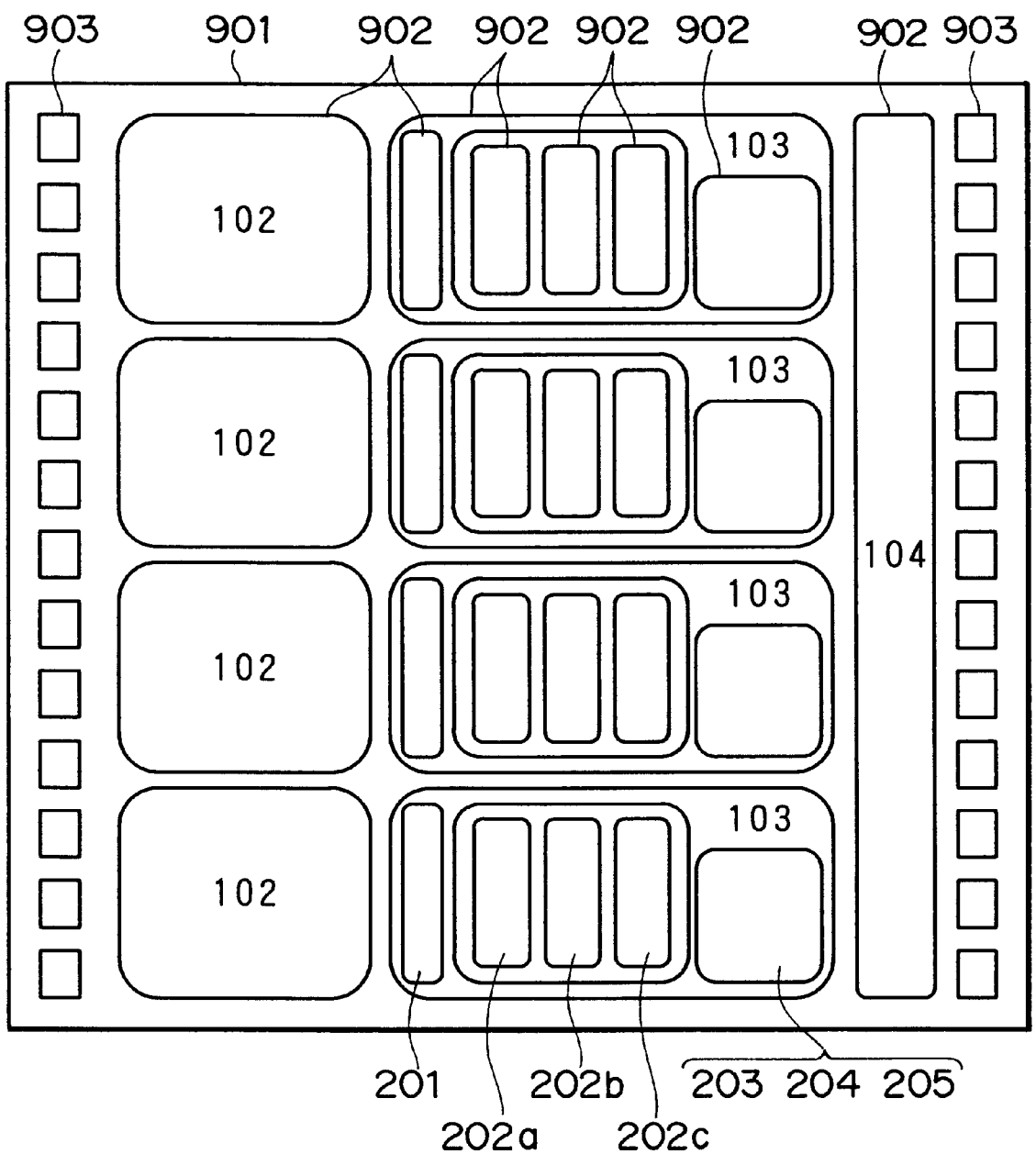
FIG. 12 is a plan view of a tenth embodiment of the present invention.

FIG. 12 shows a tenth embodiment according to the present invention in a plan view. Shown in FIG. 12 are a SOI (silicon-on-insulator) wafer 901, isolation trenches 902 and bonding pads 903. The isolation trenches 902 are formed by filling up trenches formed in the SOI wafer 901 with an insulating material. Battery circuits 102, insulating couplers 103 and a main circuit 104 formed on the SOI wafer 901 are surrounded by the isolation trenches 902, respectively, and are integrated on the SOI wafer 901.

Figure 13:
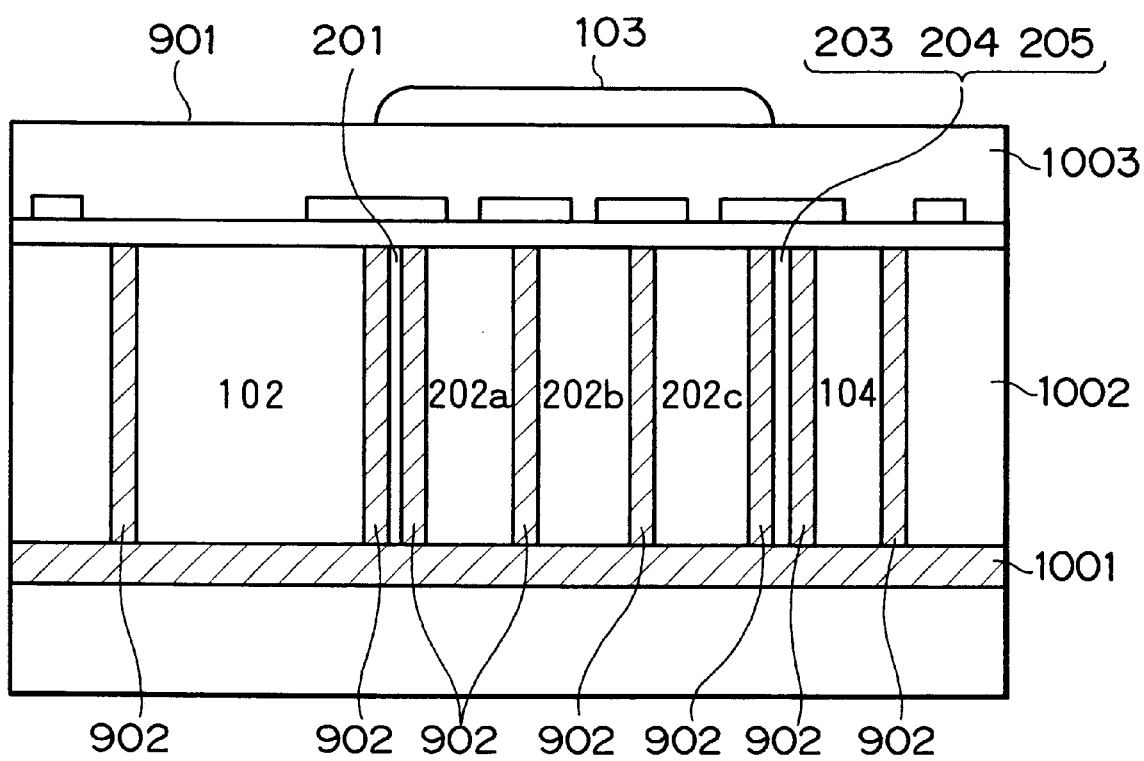
FIG. 13 is a sectional view of the tenth embodiment shown in FIG. 12.

FIG. 13 is a sectional view of the tenth embodiment shown in FIG. 12. Shown in FIG. 12 are an insulating layer 1001, a semiconductor layer 1002 and a protective layer 1003. The semiconductor layer 1002 is divided by the isolation trenches 902 into from the left toward the right as viewed in FIG. 12, and a battery circuit region for a battery circuit 102, a potential level changing circuit region for a potential level changing circuit 103 and a main circuit region for a main circuit 104 are disposed. The structure shown in FIG. 12, the SOI wafer 901 has the about 2 μm thick insulating layer 1001 of $SiO_2$, and the regions are formed are formed by thin-film deposition processes using photomasks.

The SOI wafer 901 is formed by forming the insulating layer 1001 formed of a single $SiO_2$ film or of a multilayer polysilicon film formed by superposing polysilicon films each having an oxidized surface, and forming a semiconductor layer of single-crystal silicon on a single-crystal silicon substrate. In this embodiment, the polysilicon films are bonded together by mirror-finishing the silicon dioxide layers on the polysilicon films, superposing the polysilicon films and subjecting the superposed polysilicon films to a heat treatment that heats the superposed polysilicon films at a specific temperature to form the multilayer polysilicon layer.

The isolation trenches 902 are insulating $SiO_2$ layers. The isolation trenches 902 are formed by a method that forms trenches and fills up the trenches with $SiO_2$ or BPSG (borophosphosilicate glass), a method that forms trenches, oxidizes the surfaces of the trenches in a small depth and fills up the trenches with polysilicon, a method that applies a PIV (polyimide varnish) or SOG (spin-on-glass) or a method that bombards the surface of the semiconductor layer with oxygen ions to convert the semiconductor layer into an insulating layer.

The protective layer 1003 is an insulating film of $SiO_2$, an HLD film (high-temperature low-pressure decomposition film) or an SiN film. Wiring layers of polysilicon and those of aluminum are covered with the protective layer 1003.

The insulting barrier 202 of the insulating coupler includes three electrode regions 202a, 202b and 202c and the insulating trenches 902. Dielectric strength can be secured by connecting the insulating barriers 202 in series even in the trench system in which the width of the insulating trenches 902, as compared with the thickness of the insulating layer 1001, is limited.

When the insulating barrier 202 is formed in a pattern resembling a folded band to increase the length of parts in contact with the electrode regions, a necessary capacitance can be obtained even if the area of the semiconductor is small. In this embodiment, the capacitance of an area about 160 $\mu$m square is about 2 pF, and one insulating trench 902 has a dielectric strength of about 750 V measured by a withstand voltage test. The insulating trenches 902 are formed in a pattern having folded parts and corners rounded as far as possible in circular arcs of radii of curvature in the range of 2 to 5 $\mu$m to maintain dielectric strength.

In this embodiment, a plurality of circuits are isolated from the substrate 901 by the insulating trenches 902 and the insulating layer 1001. Therefore, this integrated circuit can be directly bonded to a frame in packaging the integrated circuit and hence heat can be efficiently dissipated. In this embodiment, the insulating layer is formed of a plurality of layers and the respective thicknesses of the layers are formed in proper thicknesses, so that stress is distributed uniformly to reduce the warp of the substrate.

When this embodiment has a battery unit 101 of a lithium secondary battery, the maximum supply voltage of the battery unit 101 is on the order of 4.2 V. Therefore, the withstand voltages of the battery circuit 102 and the main circuit 104 may be on the order of 5 V; that is, the withstand voltages of the circuits surrounded by the insulating trenches 902 may be on the order of 5 V.

When the battery unit 101 of this embodiment is formed by connecting 96 lithium secondary batteries in series, the maximum supply voltage of the battery unit 101 is about 400 V, which is far lower than the withstand voltage of the insulating trenches 902. Therefore, the insulating couplers and the other circuits can be formed on the SOI wafer 901 in an integrated circuit. Thus, a small, reliable, inexpensive power storage device having a small number of circuits, capable operating at a low power consumption, excellent in control accuracy and having high noise margin can be obtained.

Eleventh Embodiment

FIG. 14 shows an eleventh embodiment of the present invention. The eleventh embodiment has a battery circuit 102 similar to that of the ninth embodiment and formed on a silicon wafer 1101. As shown in FIG. 14, a monolithic IC has the silicon wafer 1101 and components formed on the silicon wafer 1101. The components include voltage-time converting circuits 501, correction reference circuits 701 and level shifting circuits 506.

In this embodiment, the storage batteries 801 of a storage battery unit 101 are lithium secondary batteries having a maximum supply voltage of 4.2 V. Therefore, the maximum supply voltage of the storage battery unit 101 is 16.8 V when the number of the storage batteries 801 connected in series is four and is 33.6 V when the number of the storage batteries 801 connected in series is eight. Therefore, the withstand voltages of the battery circuit 102 and the level shifting circuits 802 may be 18 V or 36 V and hence the components can be easily formed on the same silicon wafer in a monolithic IC. This embodiment reduces the number of parts, and forms a small, inexpensive power storage device.

Twelfth Embodiment

FIG. 15 shows a twelfth embodiment of the present invention. Shown in FIG. 15 are a commercial power source 1201, a solar power generating system 1202, load devices 1203, a control converter 1204, switches 1205 and a multiplexer 1206. A plurality of storage battery units 101 are connected in series, and battery circuits 102 are connected across the opposite ends of the storage battery units 101, respectively. The output of each battery circuit 102 is connected through an insulating coupler and the multiplxer 1206 to a main circuit 104. The control converter 1204 is connected across the opposite ends of the series circuit of the storage battery units 101. A microcomputer 105 included in the main circuit 104, and an MCU (microprocessor control unit) included in the control converter 1204 are connected through an insulating coupler.

The solar power generating system 1202, the load devices 1203 and the control converter 1204 are connected through the switches 1205 to the commercial power source 1201. The solar power generating system 1202, the load devices 1203, the control converter 1204, the switches 1205 and the main circuit 104 are connected bilaterally by insulating couplers 103.

The solar power generating system 1202 converts solar energy into dc power by solar cells, and converts the dc power into ac power by an inverter. The load devices 1203 are domestic electric appliances including air conditioners, refrigerators, electronic ovens and illuminating devices, and electric apparatuses including motors, computers and medical appliances. The control converter 1204 is a charge-and-discharge device that converts ac power into dc power or coverts dc power into ac power. The control converter 1204 controls the solar power generating system 1202 and the load devices 1203 in addition Lo charging and discharging operations.

Those devices are connected to the switches 1205. A power storage device in this embodiment may be connected to control converters 1204 other than that shown in FIG. 15 and other devices.

When power demand of the load devices 1203 shown in FIG. 15 cannot be met by the commercial power source 1201 and the solar power generating system 1202, power is supplied from the storage battery units 101 through the control converter 1204. When excessive power is supplied by the commercial power source 1201 and the solar power generating system 1202, the control converter 1204 uses the surplus power for charging the storage battery units 101.

When the supply voltages of the storage battery units 101 rise to discharge stopping level or a charge stopping level during the foregoing operations, the main circuit 104 gives a signal to that effect to the control converter 1204 and then the control converter 1204 controls discharging or charging.

This embodiment enables the reduction of contract demand and consumption of power supplied by the commercial power source 1201, and the rated output power of the solar power generating system 1202, which reduces equipment cost and running cost.

The storage battery units 101 supply power to the commercial power source 1201 in a specific time band where power demand very high, and surplus power is stored in the power storage system while power demand is low. Thus, the concentration of power demand on the commercial power source 1201 can be moderated and power supply of the commercial power source 1201 can be leveled off.

The control converter 1204 monitors the power consumption of the load devices 1203 and controls the load devices 1203 to save energy and to use power effectively.

Figure 16:
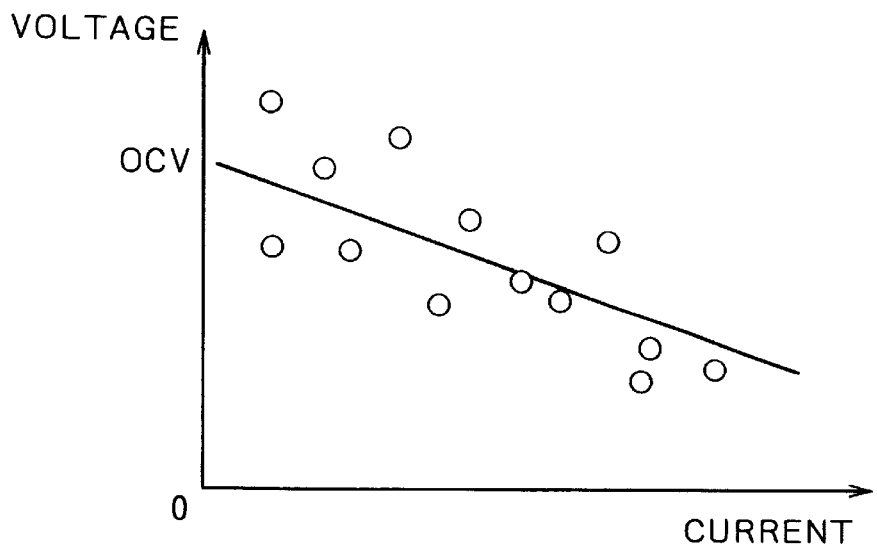
FIG. 16 is a graph of assistance in explaining operations for processing measured data.

FIG. 16 is a graph of assistance in explaining operations of this embodiment for processing measured data, in which voltage V is measured on the vertical axis (Y-axis) and a current is measured on the horizontal axis (X-axis).

The relation between measured voltage data measured by a voltage measuring circuit 125 and stored in a certain period and measured current data measured by a current measuring circuit 108 in the same period was approximated by an approximate straight line determined by a least-squares method.

The Y-intercept, i.e., a value of voltage corresponding to X=0, is the open-circuit voltage OCV of the storage battery unit 101. The gradient of the approximate straight line corresponds to the internal resistance R of the storage battery unit 101. The approximate straight line is expressed by: Y=R·I+OCV. A microcomputer processes measured voltage data measured by the voltage measuring circuit 125 and the measured current data measured by the current measuring circuit 108 to determine the open-circuit voltage and the internal resistance of the storage battery unit 101. The microcomputer estimates the residual capacity and the life of the storage battery unit 101 on the basis of the measured data.

Thirteenth Embodiment

Figure 17:
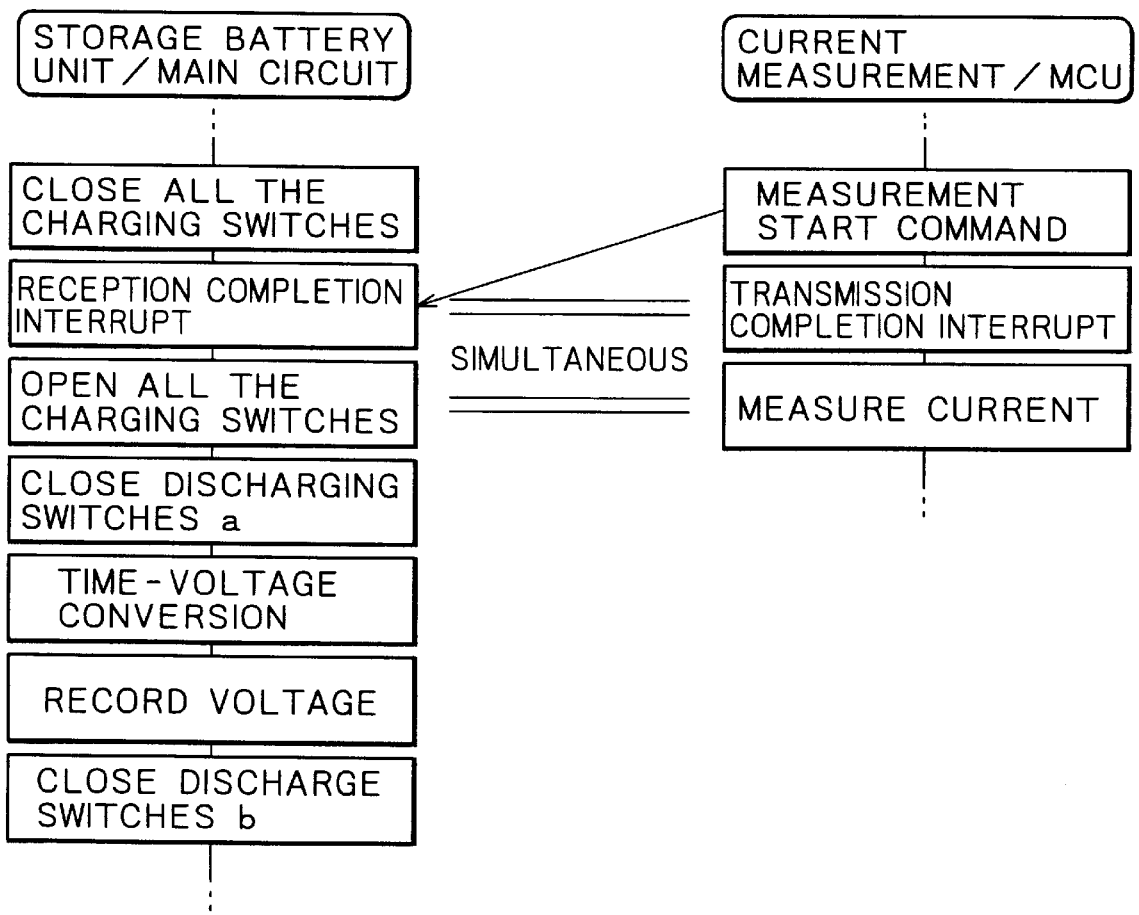
FIG. 17 is a diagram of assistance in explaining a power storage device in a thirteenth embodiment according to the present invention.

FIG. 17 shows a thirteenth embodiment of the present invention. FIG. 17 shows an essential part of an algorithm to be carried out by the microcomputer included in the circuit shown in FIG. 15.

In FIG. 15, the microcomputer 105 of the main circuit 104 and the MCU of the control converter 1204 are associated with the power storage device. The MCU and the microcomputer 105 are connected by communication lines. Each battery circuit 102 includes a voltage-time conversion circuit 501 that serves also as a voltage measuring circuit 125. The output of the battery circuit 102 is applied through the potential level changing circuit 103 and the multiplexer 1206 to the input capture terminal, not shown, of the microcomputer 105. The output of the current measuring circuit 108 is applied to the MCU.

In the battery circuits 102 and the main circuit 104, all charging switches 502 are closed. When measurement start command is provided in the current measuring circuit 108 and the MCU, the measurement start command is sent out. During communication, a reception completion interrupt and a transmission completion interrupt occur on the sending and the receiving side substantially simultaneously. Then, the battery circuits 102 and the main circuit 104 opens all the charging switches 502. The current measuring circuit 108 and the MCU start current measurement.

Operations for current measurement and opening the plurality of charging switches 502 are carried out substantially simultaneously; that is, the voltage clamping and current measurement of the plurality of storage battery units 101 are carried out simultaneously.

Since the output of the voltage-time conversion circuit 501 is applied through the multiplexer 106 to the input capture terminal as shown in FIG. 15, only one of the discharging switches a 504 is closed on the side of the battery circuits 102 and the main circuit 104 and then operations for time-voltage conversion and voltage recording are carried out. Then, the next discharging switch b is closed and the same operations are repeated.

In this case, since the voltage at the measurement of current has been clamped, the simultaneity of the measured voltage data and the measured current data can be achieved even through operations for the time-voltage conversion of the plurality of storage battery units 101 are carried out sequentially.

Fourteenth Embodiment

Figure 18:
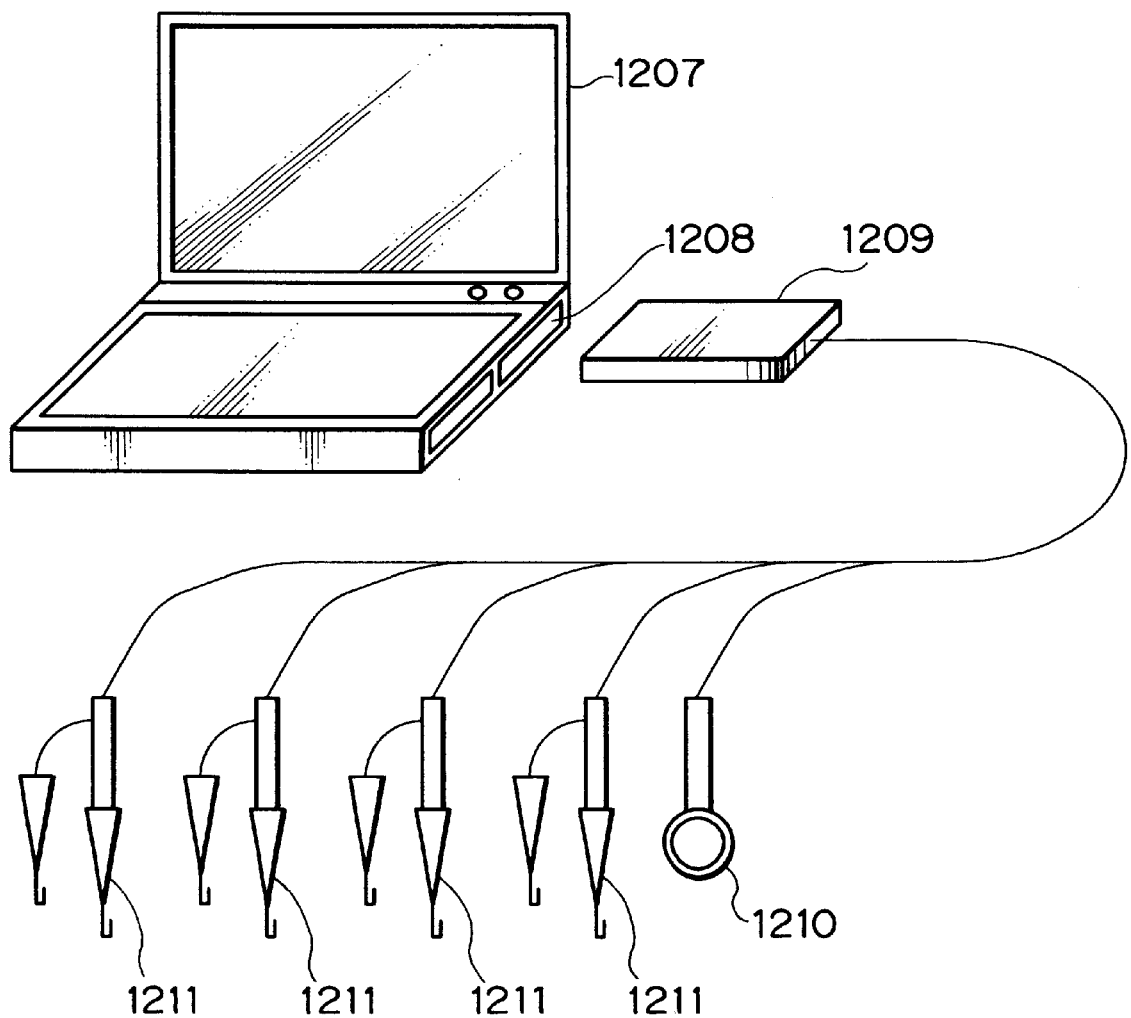
FIG. 18 is a typical view of a power storage device in a fourteenth embodiment according to the present invention.

FIG. 18 is a typical view of a fourteenth embodiment of the present invention. Shown in FIG. 18 are a personal computer 1207, a card slot 1208, a PC card 1209, a current probe 1210 of a storage battery unit 101, and voltage probes 1211 for measuring the supply voltages of the storage battery units 101. The PC card 1209 is provided with battery circuits 102, potential level changing circuits 103 and a main circuit 104. The PC card 1209 is inserted in the card slot 1208 of the personal computer 1207. The current probe 1210 and the voltage probes 1211 are connected to the PC card 1209.

This embodiment is an evaluation device using the current probe 1210 and the voltage probes 1211 as measuring terminals. In particular, when the potential level changing circuits 103 include insulating couplers, the supply voltages of the storage battery units 101 can be measured even if the potential level of the personal computer 1207 is different from that of the current probe 1210 and the voltage probes 1211.

What is claimed is:

1. A power storage device comprising:
a plurality of series-connected storage battery units;
a plurality of battery circuits that measure supply voltages of the plurality of storage battery units and provide signals corresponding Lo the supply voltages, respectively;
a plurality of potential level changing circuits that change potentials of the signals, respectively; and
a data processing circuit that receives signals of potential levels respectively determined by the potential level changing circuits and carries out predetermined data processing operations.

2. The power storage device according to claim 1 further comprising a selection circuit that selects output signals of the plurality of potential level changing circuits given to the data processing circuit and control signals provided by the data processing circuit to the plurality of battery circuits.

3. The power storage device according to claim 1 or 2, wherein each of the plurality of potential level changing circuits is provided with a capacitive insulating coupler connected across the battery circuit and the data processing circuit.

4. The power storage device according to claim 1 or 2, wherein the each of the plurality of potential level changing circuits is provided with a capacitive insulating barrier connected across the battery circuit and the data processing circuit.

5. The power storage device according to claim 1 or 2, wherein each of the plurality of battery circuit is provided with a bypass circuit that is opened and closed by a control signal.

6. A power storage device comprising:

a plurality of series-connected storage battery units;

a plurality of battery circuits that measure voltages of the plurality of storage battery units, respectively; and a data processing circuit that receives the voltages measured by the plurality of battery circuits and carries out predetermined data processing operations;

wherein the data processing circuit carries out a correction calculating process on the basis of errors in the plurality of battery circuits for correcting the received voltages.

7. A power storage device comprising;

a plurality of series-connected storage battery units;

a plurality of battery circuits that provides pulse signals respectively corresponding to voltages of the plurality of storage battery units, respectively; and a plurality of potential level changing circuits that changes potential levels of the pulse signals, respectively.

8. The power storage device according to claim 7, wherein the each of the plurality of battery circuits is provided with a capacitor, the capacitor is charged by the voltage of the corresponding storage battery unit or is charged by the voltage of the corresponding storage battery unit and is discharged, and the pulse signal generated by each of the battery circuits has a pulse width corresponding to a charging time or a discharging time.

9. A power storage device comprising:

a storage battery unit; and a pulse signal generating circuit that generates a pulse signal having a pulse width corresponding to the voltage of the storage battery unit or a pulse train having pulses generated in a time period corresponding to the voltage of the storage battery unit.

10. A power storage device comprising:

a plurality of series-connected storage battery units;

a current measuring circuit that measures a current that flows through the plurality of storage battery units and provides a signal corresponding to the measured current;

a plurality of battery circuits that measure supply voltages of the plurality of storage battery units, respectively, and generates signals respectively corresponding to the supply voltages of the storage battery units, respectively;

a plurality of potential level changing circuits that change respective potential levels of the signals, respectively; and a data processing circuit that receives the signals of potential levels determined by the potential level changing circuits and an output signal of the current measuring circuit, carries out predetermined processing operations and controls the battery circuits.

11. A method of measuring voltage of a storage battery unit, comprising:

a first step of preparing a storage battery unit;

a second step of generating a pulse signal of a pulse width corresponding to the voltage of the storage battery unit or a pulse train having pulses generated in a time period corresponding to the voltage of the storage battery unit; and a third step of determining the voltage of the storage battery on the basis of the pulse width or the number of pulses of the pulse train.

* * * * *